US012696714B2

(12) United States Patent
Brosilow

(10) Patent No.: US 12,696,714 B2
(45) Date of Patent: Jul. 28, 2026

(54) SYNCHRONIZATION BETWEEN TEMPERATURE MEASUREMENT DEVICE AND RADIATION SOURCES

(71) Applicant: CI SYSTEMS (ISRAEL) LTD., Migdal Haemek (IL)

(72) Inventor: Benjamin Brosilow, Ramot Menashe (IL)

(73) Assignee: CI SYSTEMS (ISRAEL) LTD., Migdal Haemek (IL)

( * ) Notice: Subject to any disclaimer, the term of this patent is extended or adjusted under 35 U.S.C. 154(b) by 486 days.

(21) Appl. No.: 18/020,936

(22) PCT Filed: Jul. 22, 2021

(86) PCT No.: PCT/IB2021/056623
§ 371 (c)(1),
(2) Date: Feb. 12, 2023

(87) PCT Pub. No.: WO2022/034403
PCT Pub. Date: Feb. 17, 2022

(65) Prior Publication Data
US 2024/0014052 A1 Jan. 11, 2024

Related U.S. Application Data

(60) Provisional application No. 63/064,968, filed on Aug. 13, 2020.

(51) Int. Cl.
*H10P 72/00* (2026.01)
*G01J 5/00* (2022.01)
*H10P 74/20* (2026.01)

(52) U.S. Cl.
CPC ........ *H10P 72/0436* (2026.01); *G01J 5/0007* (2013.01); *H10P 72/0602* (2026.01); *H10P 74/203* (2026.01)

(58) Field of Classification Search
CPC ......... H01L 21/67115; H01L 21/67248; H01L 22/12; G01J 5/0007
(Continued)

(56) References Cited

U.S. PATENT DOCUMENTS

| | | | | | |
|---|---|---|---|---|---|
| 5,011,295 A | * | 4/1991 | Krishnan | .............. | G01J 5/0003 |
| | | | | | 374/126 |
| 5,165,796 A | * | 11/1992 | Gat | ........................... | G01J 5/60 |
| | | | | | 250/339.04 |

(Continued)

FOREIGN PATENT DOCUMENTS

| | | | | |
|---|---|---|---|---|
| JP | 2000277446 A | * | 10/2000 | |
| JP | 2006066452 A | * | 3/2006 | |

OTHER PUBLICATIONS

International Search Report.
International Written Opinion.

*Primary Examiner* — Kristina M Deherrera
*Assistant Examiner* — Evan Mancini
(74) *Attorney, Agent, or Firm* — Rivka Friedman

(57) ABSTRACT

Methods, systems, devices, and apparatus measure temperature of a substrate by switching one or more sources between an active state and an inactive state. When in the active state, the one or more sources heat at least one portion of the substrate. When in the inactive state, the one or more sources cause substantially no radiation or a negligible amount of radiation to be generated. A temperature measuring device is synchronized to the switching between the active and inactive states, such that the temperature measuring device measures the temperature of the at least one portion of the substrate substantially only when the one or more sources are in the inactive state.

17 Claims, 9 Drawing Sheets

(58) Field of Classification Search
USPC .............................................. 374/9
See application file for complete search history.

(56) References Cited

U.S. PATENT DOCUMENTS

| | | | |
|---|---|---|---|
| 2008/0121626 A1* | 5/2008 | Thomas ............. | B23K 26/0738 |
| | | | 219/121.62 |
| 2011/0227199 A1* | 9/2011 | Hata ................. | H01L 21/67115 |
| | | | 438/479 |
| 2011/0236844 A1 | 9/2011 | Timans et al. | |
| 2011/0295539 A1 | 12/2011 | Tsai et al. | |
| 2012/0076477 A1* | 3/2012 | Kuroiwa ............. | F27B 17/0025 |
| | | | 392/407 |
| 2019/0391017 A1 | 12/2019 | Ranish | |
| 2020/0150529 A1* | 5/2020 | Kobayashi ............ | G03F 9/7042 |

* cited by examiner

1200

Switch sources to on state 1202

Switch sources to off state 1204

Measure temperature 1206

Switch sources to on state 1208

Provide synchronization signal 1210

Controller 24

Device 16

35

34

15

32

14

Substrate 12

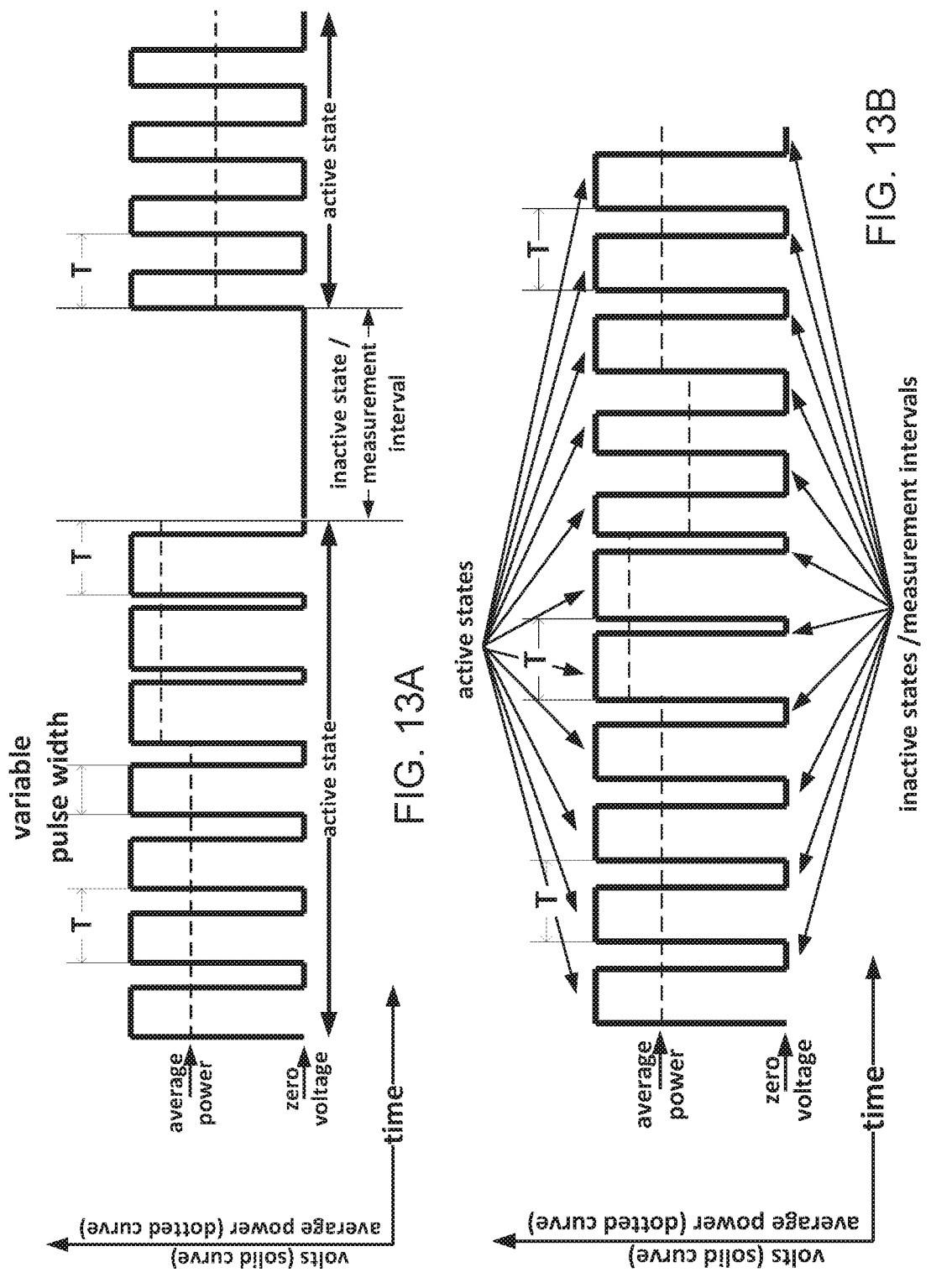

SYNCHRONIZATION BETWEEN TEMPERATURE MEASUREMENT DEVICE AND RADIATION SOURCES

CROSS-REFERENCE TO RELATED APPLICATIONS

This application claims priority from U.S. Provisional Patent Application No. 63/064,968, filed Aug. 13, 2020, whose disclosure is incorporated by reference in its entirety herein.

TECHNICAL FIELD

The present invention relates to treatment and/or processing of workpieces such as semiconductor wafers and substrates.

BACKGROUND OF THE INVENTION

In process manufacturing of semiconductor devices, various processing steps are performed in which a wafer is heated to desired temperatures on timescales of several seconds or less by heat sources, which can be in the form of high-intensity radiation sources such as LEDs, lasers or lamps. In certain cases, the wafer undergoes thermal processing in order to perform various manufacturing steps including, for example, dopant activation, thermal oxidation, metal reflow and chemical vapor deposition. In other cases, the wafer can be heated as a byproduct of certain processing operations, such as heating of the wafer due to exposure to plasma. The wafer temperature is monitored/measured, for example using radiation thermometers, in order to track the temperature profile of the wafer during processing.

SUMMARY OF THE INVENTION

The present invention is a method, apparatus, device and system for measuring/monitoring parameters of a workpiece/substrate, including the temperature of the workpiece/substrate and the reflectivity and/or emissivity of the workpiece/substrate.

In certain embodiments, the apparatus includes a device and/or one or more sensors configured to measure temperature via measurement of thermal radiation emitted by a substrate or workpiece that is heated by a plurality of radiation sources. The device and/or sensors operate in synchrony with the radiation sources, which switch between a first ("active") state in which the radiation sources irradiate the substrate so as to heat the substrate, and a second ("inactive") state in which the radiation sources do not emit radiation or emit a negligible amount of radiation such that any such radiation emitted by the radiation sources is not detected by the device (and/or sensors) or is insufficient to measurably effect measurements performed by the device (and/or sensors). In preferred embodiments, the synchronization of the device (and/or sensors) with the radiation sources is such that the device and/or sensors measure temperature (or thermal radiation) only when the radiation sources are in the inactive state, and more preferably start/begin performing such temperature/thermal radiation measurement precisely when the radiation sources are switched from the active state to the inactive state, and stop performing temperature/thermal radiation measurement of the substrate/workpiece precisely when the radiation sources are switched from the inactive state to the active state. In particularly preferred embodiments, the device and/or sensors begin measuring substrate temperature/thermal radiation exactly when the radiation sources are switched to the inactive state, and the radiation sources are switched back to the active state exactly/precisely when the device and/or sensors stop measuring substrate temperature/thermal radiation.

In certain embodiments, a first sensor operates in synchrony with the radiation sources so as to monitor/measure an intensity parameter, that varies as a function of an intensity of the thermal radiation emitted by the substrate, during periods in which the radiation sources are in the inactive state, and generates a temperature-indicative electrical signal corresponding to the intensity parameter. In some embodiments, the synchronization is provided by a controller that controls switching of the radiation sources between the two states. In other embodiments the synchronization is provided by a second sensor deployed to measure/monitor an intensity parameter that varies as a function of an intensity of the radiation emitted by the radiation sources, and that generates an intensity-indicative electrical signal corresponding to the intensity parameter. In certain embodiments, drops in the intensity-indicative signal are used to synchronize measurements performed by the first sensor with the switching of the radiation sources between the two states.

In further embodiments, the device (and/or sensors) additionally measures radiation during periods in which the radiation sources are switched to the active state in order to capture radiation reflected by the substrate in response to being irradiated by the radiation sources. In such embodiments, the captured reflected radiation can be used in order to measure or calculate the reflectivity and/or the emissivity of the substrate.

According to the teachings of an embodiment of the present invention, there is provided a method for measuring temperature of a substrate. The method comprises: switching one or more sources between: an active state in which the one or more sources heat at least one portion of the substrate, and an inactive state in which the one or more sources cause substantially no radiation or a negligible amount of radiation to be generated; and measuring temperature using a temperature measuring device synchronized to the switching between the active and inactive states such that, the temperature measuring device measures the temperature of the at least one portion of the substrate substantially only when the one or more sources are in the inactive state.

Optionally, the one or more sources irradiate the substrate during the active state so as to heat the substrate.

Optionally, the one or more sources includes a plurality of light-emitting diodes or a plurality of laser sources deployed to irradiate the substrate.

Optionally, the one or more sources includes plasma deployed to bombard the substrate with charged particles during the active state.

Optionally, the temperature measuring device is synchronized to the switching between the active and inactive states via a synchronization signal corresponding to at least one of: the inactive state, transition from the active state to the inactive state, or transition from the inactive state to the active state.

Optionally, the synchronization signal is provided by an intensity sensor deployed to sense radiation emitted by the one or more sources.

Optionally, the synchronization signal is provided by a controller associated with the one or more sources that controls switching of the one or more sources between the active and inactive states.

Optionally, the temperature measuring device includes a sensor that senses radiation emitted by the sources, and is synchronized to the switching of the one or more sources between the active and inactive states by identifying drops in the emitted radiation corresponding to initiation of the inactive state.

Optionally, the temperature measuring device is synchronized to the switching between the active and inactive states such that, the temperature measuring device begins performing temperature measurement at or after the time that the one or more sources are switched from the active state to the inactive state, and the temperature measuring device stops performing temperature measurement of the substrate at or before the time that the one or more sources are switched from the inactive state to the active state.

Optionally, the temperature measuring device is synchronized to the switching between the active and inactive states such that, the one or more sources are switched from the inactive state to the active state when the temperature measuring device stops performing temperature measurement.

Optionally, the active state is associated with at least one irradiation time-interval, and each of the at least one irradiation time-interval is a time interval during which the one or more sources emit radiation at an output power or average output power taken over the entirety of the time interval that is sufficiently high so as to heat the substrate, and the inactive state is associated with at least one measurement time-interval, and each of the at least one measurement time-interval is a time interval during which the one or more sources do not emit radiation or emit radiation at an output power that is sufficiently low so as to be negligible to the temperature measuring device.

There is also provided according to an embodiment of the teachings of the present invention a system for measuring temperature of a substrate. The system comprises: one or more sources deployed in association with the substrate, the one or more sources switchable between: an active state in which the one or more sources heat at least one portion of the substrate, and an inactive state in which the one or more sources cause substantially no radiation or a negligible amount of radiation to be generated; a controller including at least one processor and configured to switch the one or more sources between the active state and the inactive state; and a temperature measuring device configured to measure a temperature of the at least one portion of the substrate, the temperature measuring device and the switching between the active and inactive states are synchronized to each other such that, the temperature measuring device measures the temperature of the at least one portion of the substrate substantially only when the one or more sources are in the inactive state.

Optionally, the at least one temperature measuring device is synchronized to the switching of the one or more sources via a synchronization signal corresponding to at least one of: the inactive state, transition from the active state to the inactive state, or transition from the inactive state to the active state.

Optionally, the synchronization signal is provided to the at least one temperature measuring device by the controller.

Optionally, the system further comprises: at least one intensity sensor deployed to sense radiation emitted by the one or more sources.

Optionally, the at least one intensity sensor provides the synchronization signal to the at least one temperature measuring device.

Optionally, the at least one temperature measuring device measures radiation and is synchronized to the switching of the one or more sources by identifying drops in the radiation measurement corresponding to initiation of the inactive state.

Optionally, the one or more sources irradiate the substrate during the active state so as to heat the substrate.

Optionally, the one or more sources includes a plurality of light-emitting diodes or a plurality of laser sources.

Optionally, the one or more sources includes plasma deployed to bombard the substrate with charged particles during the active state.

Optionally, the temperature measuring device is synchronized to the switching between the active and inactive states such that, the temperature measuring device begins performing temperature measurement at or after the time that the one or more sources are switched from the active state to the inactive state, and the temperature measuring device stops performing temperature measurement of the substrate at or before the time that the one or more sources are switched from the inactive state to the active state.

Optionally, the switching between active and inactive states is synchronized to the temperature measuring device, such that the controller switches the one or more sources from the inactive state to the active state when the temperature measuring device stops performing temperature measurement.

Optionally, the active state is associated with at least one irradiation time-interval, and each of the at least one irradiation time-interval is a time interval during which the one or more sources emit radiation at an output power or average output power taken over the entirety of the time interval that is sufficiently high so as to heat the substrate, and the inactive state is associated with at least one measurement time-interval, and each of the at least one measurement time-interval is a time interval during which the one or more sources do not emit radiation or emit radiation at an output power that is sufficiently low so as to be negligible to the temperature measuring device.

There is also provided according to an embodiment of the teachings of the present invention a method that comprises: switching one or more sources between: an active state in which the one or more sources heat the substrate, and an inactive state in which the one or more sources cause substantially no radiation or a negligible amount of radiation to be generated; and measuring thermal radiation emitted by the substrate using a device synchronized with the switching between the active and inactive states such that, the device measures the thermal radiation emitted by the substrate substantially only when the one or more sources are in the inactive state.

Optionally, the method further comprises: calculating a temperature of the substrate based on the measured thermal radiation.

Optionally, the device is synchronized to the switching between the active and inactive states such that, the device begins performing thermal radiation measurement at or after the time that the one or more sources are switched from the active state to the inactive state, and the device stops performing thermal radiation measurement at or before the time that the one or more sources are switched from the inactive state to the active state.

Optionally, the device is synchronized to the switching between the active and inactive states such that, the one or more radiation sources are switched from the inactive state to the active state when the device stops performing thermal radiation measurement.

There is also provided according to an embodiment of the teachings of the present invention a method for measuring temperature of a substrate that is periodically irradiated by a plurality of radiation sources that are switchable between an active state in which the radiation sources irradiate the substrate so as to heat at least one portion of the substrate and an inactive state in which the radiation sources emit substantially no radiation or a negligible amount of radiation. The method comprises: performing, by a temperature measuring device, a temperature measurement of at least one portion of the substrate during the periods for which the radiation sources are in a deactivated state in accordance with a synchronization signal received by the temperature measuring device, the synchronization signal indicative of at least one of: i) periods for which the radiation sources are in the active state, ii) periods for which the radiation sources are in the inactive state, iii) transitions of the radiation sources from the active state to the inactive state, or iv) transitions of the radiation sources from the inactive state to the active state, such that the temperature measuring device begins performing temperature measurement at or after the time that the one or more radiation sources are switched from the active state to the inactive state, and the temperature measuring device stops performing temperature measurement of the substrate at or before the time that the one or more radiation sources are switched from the inactive state to the active state.

Optionally, the method further comprises: terminating the temperature measurement by the temperature measuring device during periods for which the radiation sources are in the active state.

Optionally, the temperature measurement device includes at least one sensor for sensing thermal radiation emitted by the substrate and generating a temperature-indicative signal in response to the sensed radiation, and the method further comprises: de-coupling signal amplification electronics from the at least one sensor before or when the radiation sources are switched from the inactive state to the active state.

Optionally, the synchronization signal is provided to the temperature measuring device by a controller that switches the radiation sources between active and inactive states.

Optionally, the synchronization signal is provided by an intensity sensor deployed to sense radiation emitted by the radiation sources.

There is also provided according to an embodiment of the teachings of the present invention a temperature measuring device for measuring temperature of a substrate that is periodically irradiated by a plurality of radiation sources that are switchable between an active state in which the radiation sources irradiate the substrate so as to heat at least one portion of the substrate and an inactive state in which the radiation sources emit substantially no radiation or a negligible amount of radiation. The temperature measuring device comprises: a sensor that senses thermal radiation emitted by the substrate and generates a temperature-indicative signal in response to the thermal radiation sensed during periods for which the radiation sources are in the inactive state in accordance with a synchronization signal received by the temperature measuring device, the synchronization signal indicative of at least one of: i) periods for which the radiation sources are in the active state, ii) periods for which the radiation sources are in the inactive state, iii) transitions of the radiation sources from the active state to the inactive state, or iv) transitions of the radiation sources from the inactive state to the active state, such that the temperature measuring device begins performing temperature measurement at or after the time that the one or more radiation sources are switched from the active state to the inactive state, and the temperature measuring device stops performing temperature measurement of the substrate at or before the time that the one or more radiation sources are switched from the inactive state to the active state.

There is also provided according to an embodiment of the teachings of the present invention a temperature measuring device for measuring temperature of a substrate that is periodically irradiated by a plurality of radiation sources that are configured to switch between an active state in which the radiation sources irradiate the substrate so as to heat the substrate and an inactive state in which the radiation sources emit substantially no radiation or a negligible amount of radiation. The temperature measuring device comprises: a sensor that senses thermal radiation emitted by the substrate and generates a temperature-indicative signal in response to the sensed thermal radiation, the temperature measuring device is synchronized to switching of the radiation sources between the active and inactive states such that the sensor generates the temperature-indicative signal only during periods for which the radiation sources are in the inactive state.

There is also provided according to an embodiment of the teachings of the present invention an apparatus configured to operate with, or as part of, a thermal processing system for processing a substrate, the thermal processing system having a plurality of switchable radiation sources configured to switch between an active state in which the radiation sources irradiate the substrate so as to heat at least one portion of the substrate and an inactive state in which the radiation sources emit substantially no radiation or a negligible amount of radiation. The apparatus comprises: a first sensor for sensing thermal radiation emitted by the substrate and for generating a temperature-indicative signal in response to the sensed thermal radiation; a second sensor for sensing radiation emitted by the radiation sources and for generating a synchronization signal corresponding to the inactive state; an amplifier circuit; and a controllable switch associated with the first sensor and the amplifier circuit and configured to switch, based on the synchronization signal, between: an open position in which the amplifier circuit is de-coupled from the first sensor, and a closed position in which the amplifier circuit is placed in signal communication with the first sensor only during periods in which the radiation sources are in the inactive mode.

There is also provided according to an embodiment of the teachings of the present invention an apparatus configured to operate with, or as part of, a thermal processing system that processes a substrate, the thermal processing system having a plurality of switchable radiation sources configured to switch between an active state in which the radiation sources irradiate the substrate so as to heat at least one portion of the substrate and an inactive state in which the radiation sources emit substantially no radiation or a negligible amount of radiation. The apparatus comprises: a temperature measuring device including at least one sensor for sensing thermal radiation, generating a signal corresponding to the sensed thermal radiation, detecting drops in the signal corresponding to periods in which the radiation sources transition from the active state to the inactive state, and producing a temperature measurement of the at least one portion of the substrate based on the sensed thermal radiation and the detected drops in the signal.

There is also provided according to an embodiment of the teachings of the present invention a method that comprises: switching one or more radiation sources between: an active state in which the one or more radiation sources irradiate at a substrate so as to heat the substrate, and an inactive state in which the one or more radiation sources emit substantially no radiation or emit a negligible amount of radiation; performing by a device synchronized to the switching between the active and inactive states: a first radiation measurement during the inactive state, the first radiation measurement including radiation corresponding to thermal emission by the substrate, and a second radiation measurement during the active state, the second radiation measurement including radiation corresponding to thermal emission by the substrate and radiation reflected by the substrate in response to radiation emitted by the one or more radiation sources; and calculating, based on the first and second radiation measurements, at least one of a reflectivity of the substrate or an emissivity of the substrate.

Unless otherwise defined herein, all technical and/or scientific terms used herein have the same meaning as commonly understood by one of ordinary skill in the art to which the invention pertains. Although methods and materials similar or equivalent to those described herein may be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE DRAWINGS

Some embodiments of the present invention are herein described, by way of example only, with reference to the accompanying drawings. With specific reference to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

Attention is now directed to the drawings, where like reference numerals or characters indicate corresponding or like components. In the drawings:

FIGS. 13A and 13B are schematic representations of pulse width modulation (PWM) voltage waveforms that can be used by the controller of the present disclosure to control the radiation sources;

DESCRIPTION OF THE PREFERRED EMBODIMENTS

Figures 1, 2, 3:
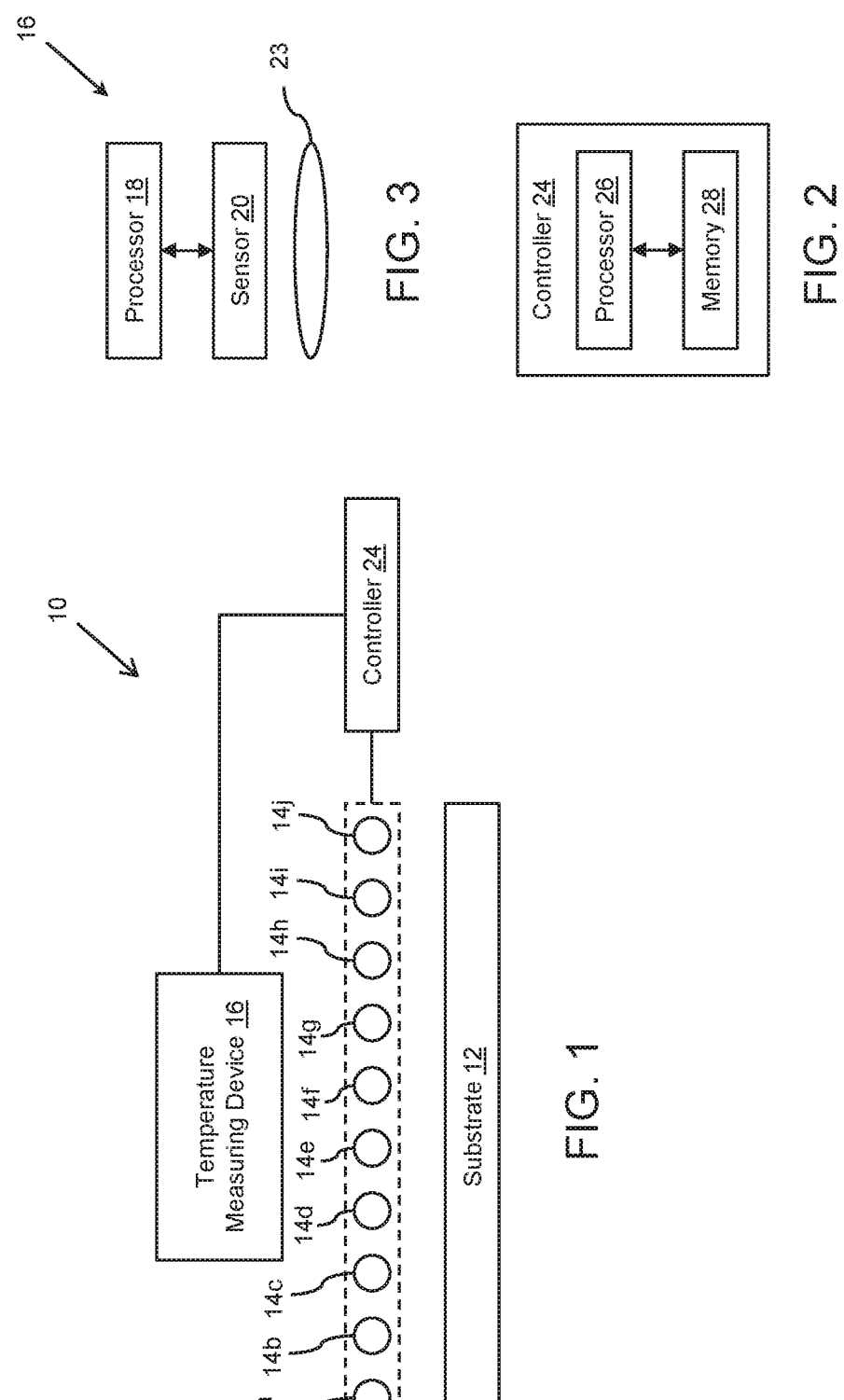
FIG. 1 is a schematic representation of a system having a measuring device having a sensor for measuring/monitoring/tracking thermal radiation and temperature of a substrate, heated by switchable radiation sources that are switchable between active and inactive states, and that is synchronized to the switching of the radiation sources between the active and inactive states, according to an embodiment of the present invention in which synchronization is provided by a controller that controls switching of the radiation sources.
FIG. 2 is a block diagram of the controller of FIG. 1.
FIG. 3 is a schematic representation of the measuring device of FIG. 1.

The present invention is a method, apparatus, device and system for measuring/monitoring the temperature of a workpiece/substrate.

The principles and operation of the methods, apparatus, devices and systems according to present invention may be better understood with reference to the drawings accompanying the description.

Before explaining at least one embodiment of the invention in detail, it is to be understood that the invention is not necessarily limited in its application to the details of construction and the arrangement of the components and/or methods set forth in the following description and/or illustrated in the drawings and/or the examples. The invention is capable of other embodiments or of being practiced or carried out in various ways.

Referring now to the drawings, FIGS. 1-3 illustrate various aspects of a workpiece processing system, generally designated 10, constructed and operative according to various aspects of the present disclosure. In general terms, the workpiece processing system (hereinafter referred to as "the system") 10, which can be deployed in or as part of a thermal processing chamber for example when implemented as a thermal processing system, includes an apparatus for providing temperature monitoring/measurement during processing of a workpiece 12. In general, the workpiece 12 can be any thin plate-like material substrate, such as a semiconductor wafer, semiconductor substrate, or a glass substrate. Without loss of generality, the workpiece will be referred to hereinafter interchangeably as a substrate 12.

The system 10 generally includes one or more controllable sources 14 deployed to be switchably activated thus selectively heat the substrate, a controller 24 for controlling the sources 14, and a measuring device 16 that measures one or more parameters of the substrate 12 based on radiation emitted or reflected by the substrate 12 in response to irradiation and/or heating by the sources 14. According to a first aspect of the present disclosure, the device 16 is configured to measure the temperature of the substrate 12 based on the thermal radiation emitted by the substrate 12. In embodiments according to this first aspect of the present disclosure, the device 16 is also referred to interchangeably as a "temperature measuring device". According to a second aspect of the present disclosure, the device 16 measures thermal radiation emitted by the substrate as well as radiation reflected from the substrate in order to enable determination of the reflectivity and/or the emissivity of the substrate 12.

According to certain preferred but non-limiting embodiments, the one or more sources 14 is a plurality of electronically controllable and switchable radiation sources 14a-14j, collectively referred to as radiation sources 14, which in certain embodiments can be implemented as an array of radiation sources, deployed to irradiate the substrate 12 so as to heat the substrate 12. Although ten radiation sources are illustrated herein for example purposes, the system 10 may include fewer than ten sources, or more than ten sources, depending on the thermal processing application. In such embodiments, the radiation sources 14 are also interchangeably referred to as "sources" or "heat sources". The heat sources 14 are preferably configured to heat at least part of the substrate 12 or the entirety of the substrate 12 to a desirable temperature depending on the application, which can be, for example, 175° C. or higher, and in certain cases 200° C. or higher, and in other cases 300° C. or higher. When used in the context of a rapid thermal processing system, the radiation sources 14 can be configured to heat the substrate 12 to even higher temperatures, including 1000° C. or higher.

Parenthetically, although the sources 14 are implemented as radiation sources for irradiating the substrate 12 so as to heat the substrate 12, other embodiments are contemplated herein in which there is not necessarily a causal relationship between radiation generated by the sources 14 and the heating of the substrate 12. For example, and as will be discussed in subsequent sections of the present disclosure, certain types of sources may be switchably activated to heat the substrate 12 and as a side-effect or byproduct of the activation of the sources 14 may cause generation of radiation (i.e., radiation emission) which is not the cause of the substrate heating. Throughout the majority of the remaining portions of the present disclosure, the sources 14 will be described within the context of being radiation sources for irradiating the substrate 12, and where applicable will be more generally described as sources generally configured to be activated which heats the substrate 12.

Bearing the above in mind, the radiation sources 14 are generally configured to switch between operating in two states, namely an active state in which the radiation sources 14 irradiate the substrate 12 so as to heat the substrate 12, and an inactive state in which the radiation sources 14 do not irradiate the substrate, either by not emitting radiation or by emitting a negligible amount of radiation over the duration of time for which the radiation sources 14 are in the inactive state. In certain non-limiting implementations, the intensity (i.e., power) emitted by the sources 14 can vary between a minimum intensity/power value and a maximum intensity/power, thereby enabling, in combination with the amount of time during which the radiation sources 14 emit radiation at the minimum and maximum intensity, controlled variability in the desired temperature of the substrate 12. The minimum intensity/power value can be, for example, 0 Watts/cm$^2$, and the maximum intensity/power value can be, for example 20 Watts/cm$^2$. These minimum and maximum values may vary depending on the application.

Within the context of this document, the term "active state" is used interchangeably with the terms "activated state", "active", and "activated", and generally refers to the state in which the sources 14 heat the substrate 12. In particularly preferred but non-limiting embodiments in which the sources 14 are radiation sources, the active state refers to the state in which the radiation sources irradiate the substrate 12 by emitting radiation over a given period of time that is sufficiently high enough to heat the substrate. In such embodiments, the active state corresponds to a time interval or period of time during which the radiation sources 14 emit radiation at an output power or average output power (taken over the entirety of that time interval/period) that is sufficiently high so as to measurably heat the substrate (preferably in accordance with a desired temperature profile). The time-intervals (i.e., time periods) during which the radiation sources 14 are in the active state are referred to interchangeably as "irradiation time-intervals" or "irradiation periods". In the general case in which the sources 14 do not irradiate the substrate but nevertheless heat the substrate when thein the active state, time-intervals during which the sources 14 are in the active state can be equivalently referred to as "active state time-intervals" or "active state periods" as well as any of the other interchangeable terms used for "active state" in combination with the term "time-interval(s)" or "period(s)".

Similarly, within the context of this document, the term "inactive state" is used interchangeably with the terms "deactivated state", "inactive", and "deactivated", and generally refers to the state in which the radiation sources 14 do not irradiate the substrate 12, or in the more general case cause substantially no radiation or a negligible amount of radiation to be generated. In embodiments in which the sources 14 are radiation sources which irradiate the substrate 12 during the active state, when in the inactive state the radiation sources 14 do not (i.e., cease to) emit radiation, or emit a negligible amount of radiation (from the perspective of the device 16), or emit residual low levels of radiation during short time periods immediately after switching from the active state to the inactive state. In such embodiments, the inactive state corresponds to a time interval or period of time during which the radiation sources 14 emit radiation at an output power or average output power (taken over the entirety of that time interval/period) that is either zero (i.e., the radiation sources 14 do not emit any radiation) or is sufficiently low such that the radiation sources 14 emit a negligible amount of radiation (i.e., a very low non-zero amount of output power, e.g., $\ll 1$ Watt/cm$^2$). The time-intervals during which the radiation sources 14 are in the inactive state are referred to interchangeably as "measurement time-intervals" or "measurement periods". In the general case in which the sources 14 do not irradiate the substrate but nevertheless heat the substrate when thein the active state, time-intervals during which the sources 14 are in the inactive state can be equivalently referred to as "inactive state time-intervals" or "inactive state periods" as well as any of the other interchangeable terms used for "inactive state" in combination with the term "time-interval(s)" or "period(s)".

A single measurement time-interval corresponds to the period of time between a first time-instance and a second time-instance, whereby the first time-instance is the instance of time at which the radiation sources 14 assume the inactive state and the second time-instance is the instance of time at which the radiation sources 14 assume the active state consecutively after assuming the inactive state.

Within the context of this document, the term "negligible amount of radiation" generally refers to any amount of radiation that is not detectable by the temperature measuring device 16 or is insufficient to noticeably effect temperature measurements of the substrate 12 performed by the temperature measuring device 16.

The controller 24 is electrically associated with the radiation sources 14 and is configured to actuate the radiation sources 14 to turn on and off so as to control the radiation sources 14 to switch between the active and inactive states at an appropriate switching rate. In certain embodiments, the switching rate can be static/constant, and can be pre-programmed into the controller 24. In other embodiments, the switching rate can be dynamic. The switching rate can depend on the rate of heating and the desirable temperature to which the substrate 12 is to be heated, which may depend on the particular heat treatment application. The controller 24 is preferably further configured to adjust the intensity/power of the radiation emitted by the radiation sources 14 when in the active state. In addition, and as will be discussed in further detail in subsequent sections of the present disclosure, the controller 24 can employ various techniques for controlling the switching between active and inactive states, and the radiation intensity output of the radiation sources 14. In a preferred but non-limiting implementation, the controller 24 employs pulse width modulation (PWM) to control the switching and radiation intensity output of the radiation sources 14.

FIG. 2 is a schematic block diagram of the controller 24, showing a processor 26, which can be one or more computer processors (e.g., microprocessors, microcontrollers, signal processors, and the like) coupled to a computer storage medium, represented schematically as memory 28. Such processors include, or may be in communication with computer readable media (e.g., memory 28), which stores computer program code or instruction sets that, when executed by the processor, cause the processor to perform actions. Types of computer readable media include, but are not limited to, electronic, optical, magnetic, or other storage or transmission devices capable of providing a processor with computer readable instructions. The memory 28 can be any type of memory for storing data and information, and can also store computer program code or instruction sets for executing by the processor 26.

In certain embodiments, the individual radiation sources 14a-14j are independently controllable by the controller 24, such that the controller 24 can independently and selectively turn each radiation source on and off. In other embodiments, the radiation sources 14 are collectively switched on and off by the controller 24, such that when the controller 24 issues an "on" control command, all of the radiation sources 14 are switched on simultaneously, and when the controller 24 issues an "off" control command, all of the radiation sources 14 are switched off simultaneously.

The temperature measuring device 16 (also referred to as a "temperature measurement device" or simply "device") is deployed to measure the temperature of portions of the substrate 12, which may be part of the substrate 12 or the entirety of the substrate 12. In certain embodiments, the temperature measuring device 16 is implemented as a radiation thermometer, such as a temperature probe, which can be a standalone component that is independent from the radiation sources 14 and controller 24 of the system 10, or can be integrated together with other components of the system 10.

In certain preferred embodiments, the radiation sources 14 are deployed relative to the substrate 12 so as to irradiate the substrate 12 from a wide range of angles, such that the entirety of the substrate 12 is heated. In such embodiments, the radiation sources 14 can be configured as an array of heat sources.

In a particularly preferred but non-limiting set of implementations, the sources 14 are implemented as a plurality of electronically switchable light-emitting diodes (LEDs) (optionally deployed in an array), or as an arrangement of laser sources, configured to emit radiation at a particular wavelength range and preferably from a wide range of angles in order to heat the substrate 12 to the desired temperature. LEDs and lasers provide several advantages over incandescent and other types of lamps in thermal processing, in particular the precision with which the LEDs and lasers can be electronically controlled. In addition, LEDs and lasers can be rapidly switched on and off, allowing the LEDs to go from emitting zero power to full power (and vice versa) in a small fraction of a second.

Figure 4:
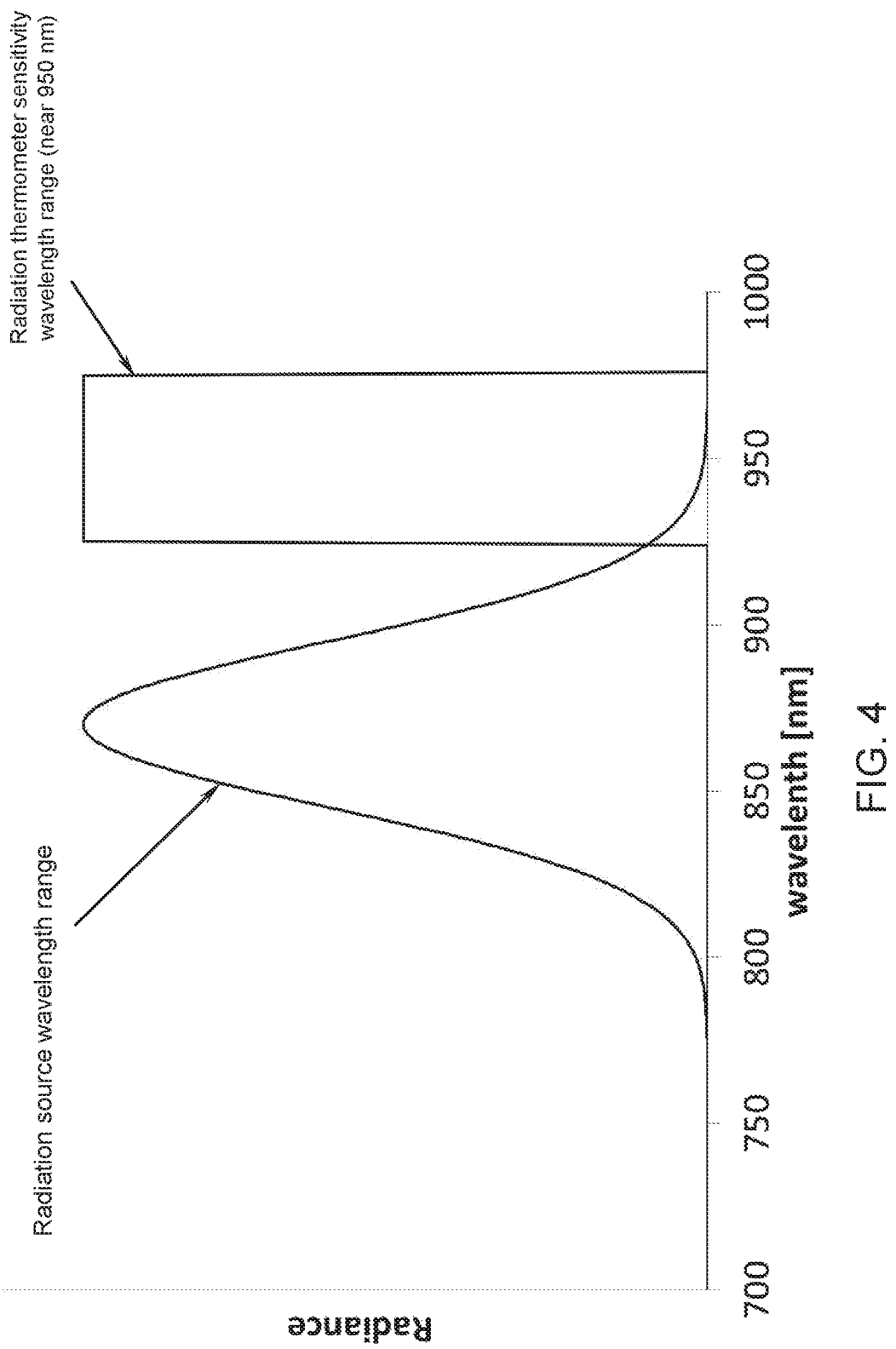
FIG. 4 is a plot illustrating wavelengths at which example radiation sources emit radiation for heating a substrate, and wavelengths of radiation to which a measuring device is sensitive.
Figure 5:
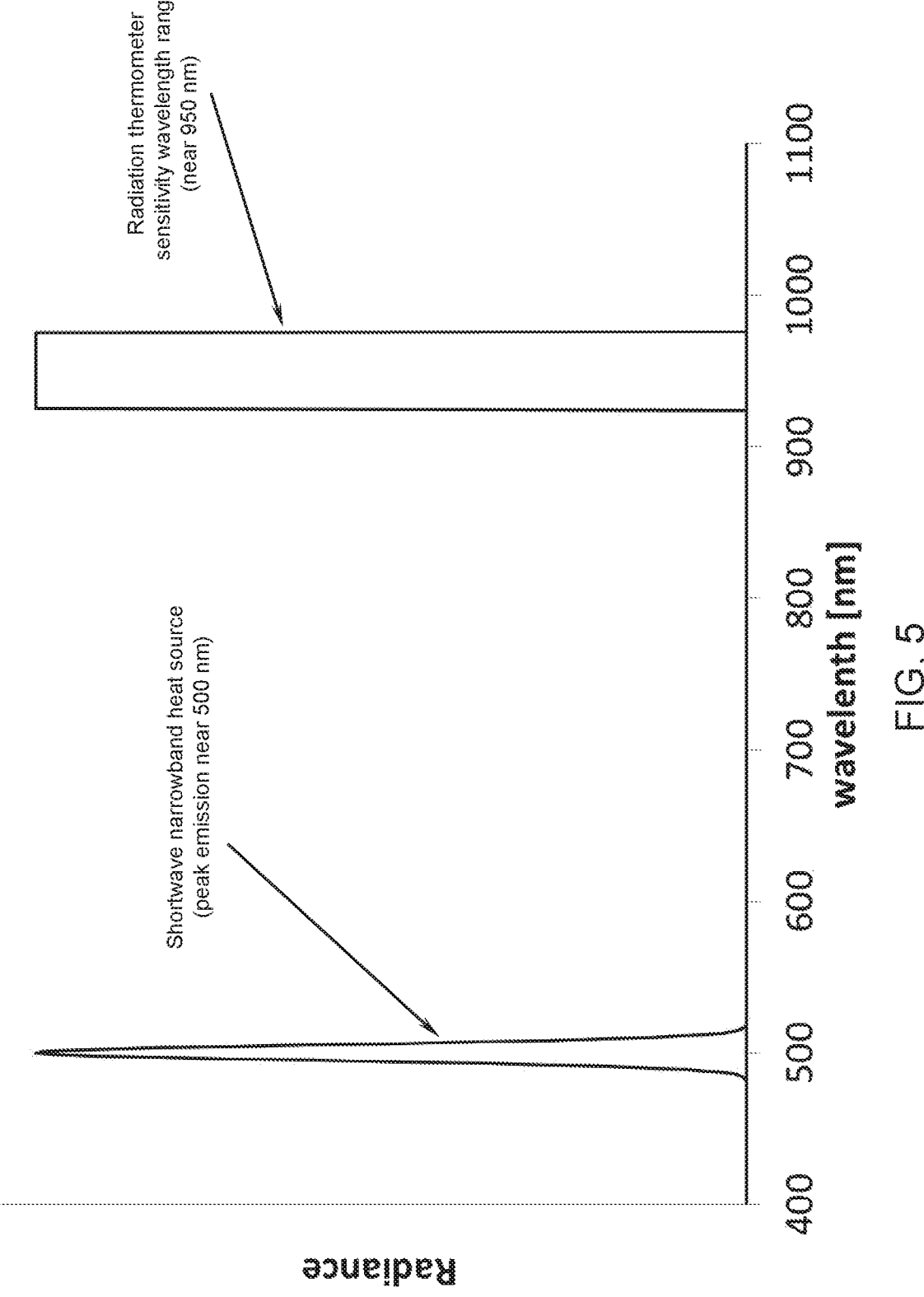
FIG. 5 is a plot illustrating wavelengths at which example narrowband radiation sources emit radiation for heating a substrate, and wavelengths of radiation to which a measuring device is sensitive.
Figure 6:
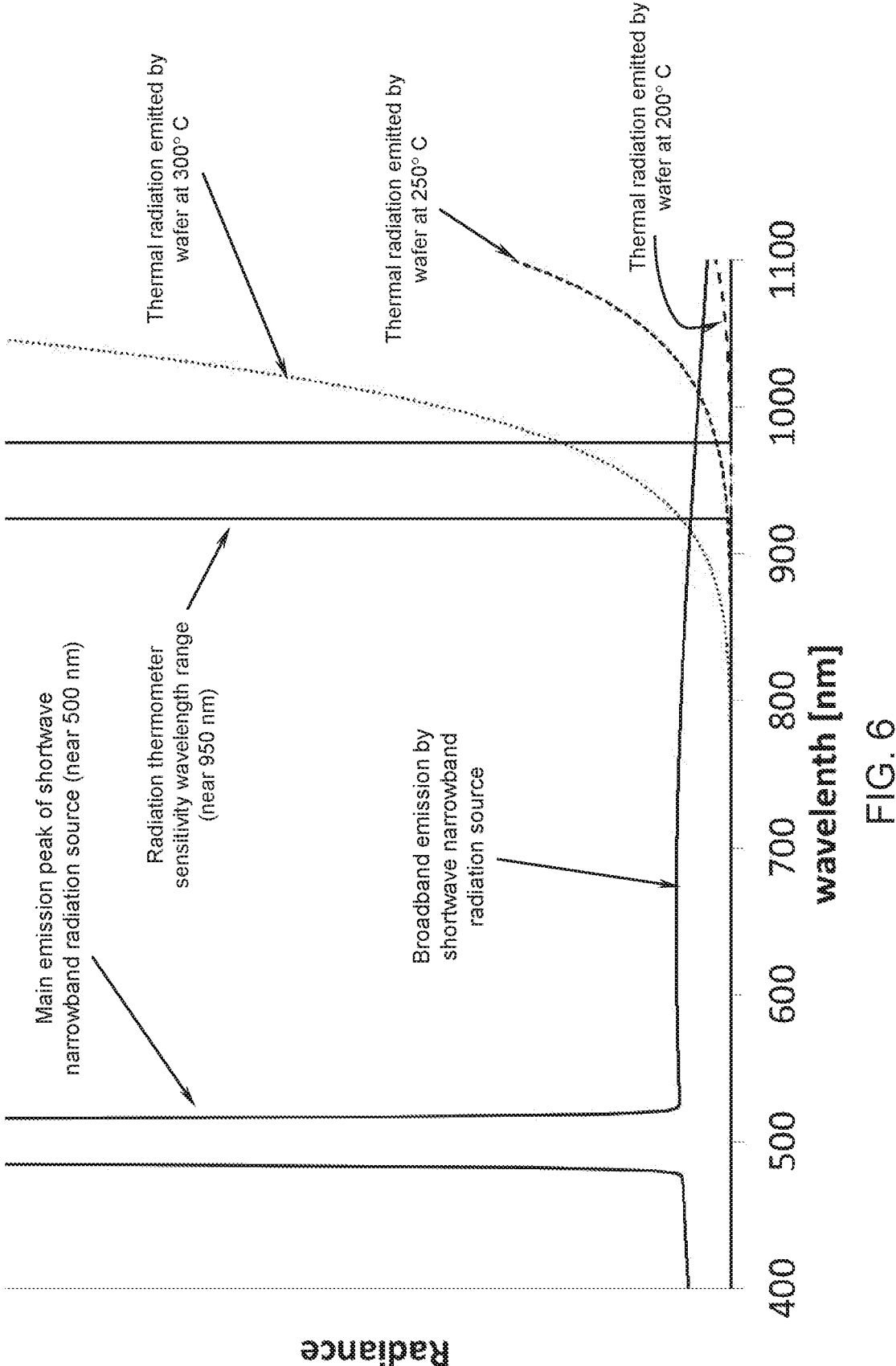
FIG. 6 is a closeup view of a low radiance region of the plot of FIG. 5, showing overlap between some of the low intensity broadband radiation emitted by the radiation sources and the wavelengths for which the measuring device is sensitive, as well as the overlap with the wavelengths at which thermal radiation is emitted by the substrate when heated to various example temperatures.

It is noted, however, that the radiant output of LEDs, lasers or other radiation sources can overlap at least partially with a particularly desirable wavelength range for measuring the temperature of the substrate 12 by the temperature measuring device 16. This can be seen in the example illustrated in FIG. 4, where the temperature measuring device 16 operates at approximately 950 nm, and the sources emit peak radiation at approximately 870 nm but also emit radiation up to 950 nm. Thus, the radiation emitted by the LEDs/lasers/sources—when switched on—can interfere with the temperature measurement of the substrate 12. Even LED and laser heat sources that operate far from the temperature probe operation wavelength band, for example near 500 nm, still emit broadband radiation that, although generally weak, can still overlap and interfere with the temperature measuring devices 16 operating at longer wavelengths near, for example, near 950 nm. This is illustrated in FIG. 5, where the radiation sources 14 emit narrowband peak radiation near 500 nm, but still emit broadband radiation (shown in the closeup view of FIG. 6) that is strong enough to interfere with low thermal signal levels emitted by the substrate 12 when heated to various example temperature levels (175° C., 200° C., and 300° C. in this example). Thus, temperature measurements that are performed during periods in which the radiation sources 14 are in the active state can obscure the temperature readings of the substrate 12.

In order to prevent radiation from the radiation sources 14 from obscuring of the temperature readings of the substrate 12, the temperature measuring device 16 according to embodiments of the present disclosure is synchronized to the switching of the radiation sources 14 between the active and inactive states, such that the temperature measuring device 16 begins performing temperature measurement at the same time, or a small amount of time after the time, that the sources 14 are switched from the active state to the inactive state, and such that the temperature measuring device 16 stops performing temperature measurement of the substrate 12 at the same time, or a small amount of time before the time, that the sources 14 are switched from the inactive state to the active state. In this way, the only meaningful temperature measurements performed by the temperature measuring device 16 are performed during periods in which the radiation sources 14 are in the inactive state. Note that the "small amount of time" at the beginning and/or end of the inactive-state during which the device 16 does not measure temperature, is generally chosen to be an interval of sufficient length to allow for whatever uncertainty may exist between the synchronization signals and the exact time of the transition of the sources 14 to/from the inactive state. The addition of these small intervals at the beginning and/or end of the inactive state when the device 16 does not measure, is to ensure that even in the face of uncertainty in the precise time of the transition to/from the inactive state, the device 16 will still always measure only when the sources 14 are in the inactive state. Additionally, in the typical case where the device 16 requires a certain minimum amount of time to complete a temperature measurement, allowance may be taken to ensure that the inactive-to-active transition of the sources 14 does not occur while the device 16 is in the middle of such a temperature measurement. (So, in practice the device 16 may only be allowed to begin a temperature measurement if there is sufficient time to complete this measurement prior to the next inactive-to-active transition of the sources 14).

Figure 7:
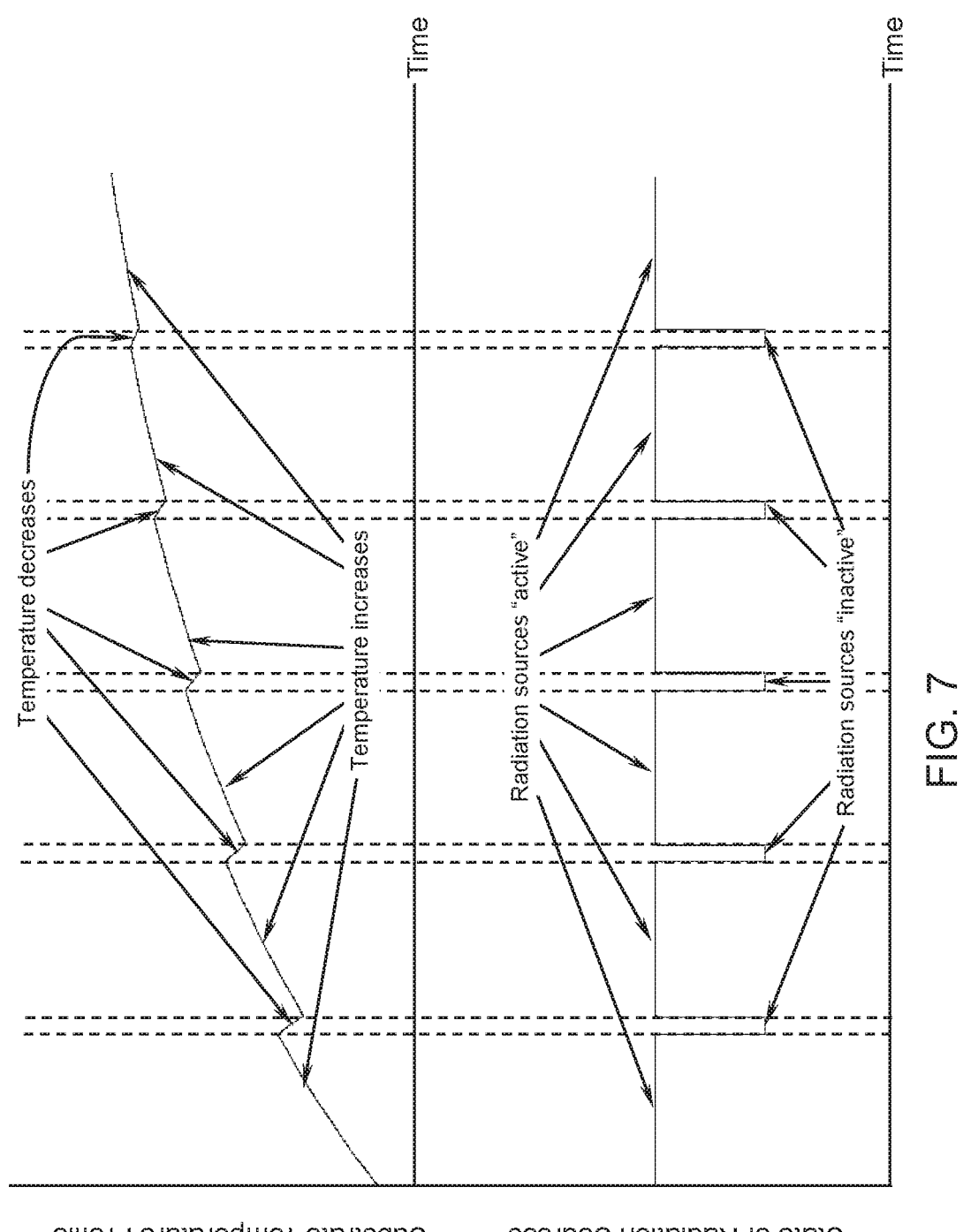
FIG. 7 is a diagram illustrating active and inactive switching states of the radiation sources over time, together with the temperature profile trend of a substrate heated by the radiation sources during the active states.

Generally, the substrate 12 temperature will drop each time the radiation sources are placed in the inactive state, resulting in a heating profile qualitatively similar to that shown schematically in FIG. 7. In situations where tight control of the temperature profile is required, and/or situations where the cooling of the substrate is rapid during the inactive-state time-intervals, it is generally desirable to reduce to a minimum the time-interval during which the radiation sources 14 are in the inactive-state, in order to reduce the magnitude of the temperature-drops which occur during the inactive-state time-interval. To this end, the radiation sources 14 can preferably be implemented as LEDs, lasers, or other radiation sources with rapid response-times. (LEDs and lasers each typically have rise/fall-times on-the-order of 1 μsec or faster). Use of rapid-response-time radiation sources allows the temperature measurement to begin nearly immediately after the initiation of the inactive state, and allows the active-state to be reestablished nearly immediately after the completion of the temperature measurement. This differs from radiation sources with slower-response-times such as, for example, incandescent radiation sources, which have rise/fall-times on the order of a few 0.1 seconds or longer. Such slower-response-time radiation sources require delaying the start of the temperature measurement until the radiation level from the slow-response-time source has decayed to the point that it no longer interferes with the temperature measurement. Similarly, the slow-response-time radiation source requires some time to return fully to the active state after the completion of the inactive state temperature measurement. Thus, the magnitude of the temperature drops during the inactive-state time-intervals can be made smaller by the use of LED, laser or other rapid-response-time radiation sources.

In certain preferred but non-limiting implementations, a pulse-width-modulation (PWM) control method can be used to vary the average power applied to the radiation sources. FIGS. 13A and 13B show exemplary PWM voltage waveforms used for PWM control. When the PWM control method is used, there are two potential ways to synchronize between the temperature probe and the radiation sources:

a) When the temperature-probe measurement-time is long relative to the PWM cycle time T, it is required to put the radiation sources in the inactive state for one or more entire PWM cycles in order to capture a temperature measurement. This case is illustrated in FIG. 13A, which shows one inactive-state (measurement time interval), preceded and followed by active-state intervals where higher average power is applied to the radiation sources.

b) When the temperature-probe measurement-time is short relative to the PWM cycle-time T, it may be possible to fit a temperature measurement inside the low-voltage intervals which are inherently present during each PWM cycle (whenever the PWM duty-cycle is <100%). In this implementation, the inactive-state occurs naturally during the PWM cycle, eliminating the need to insert special inactive-state measurement intervals in-between the PWM voltage pulses. This approach is illustrated schematically in FIG. 13B. The approach shown in this figure requires not only rapid temperature measurement times (<<T), but also rapid switching between active and inactive states. As mentioned previously, LED and laser radiation sources are particularly well suited to this situation where rapid switching is needed.

It will be appreciated that achieving the inactive state does not require application of precisely zero voltage, current, power, or other appropriate excitation to the radiation sources, but rather only requires that sufficiently low excitation be applied to ensure that the radiation sources emit at levels below that which will interfere with the temperature probe measurement.

The active time-interval and the measurement time-interval will now be discussed in further detail. For clarity of illustration, the time-intervals will be described in the non-limiting context of the sources 14 being radiation sources whereby the active time-interval is equivalently referred to as the irradiation time-interval. As should be apparent, the irradiation time-interval and the measurement time-interval can each include multiple intervals. Typically, the irradiation time-intervals alternate with the measurement time-intervals corresponding to the active/inactive state switching of the radiation sources 14, such that the radiation sources 14 go through successive alternating active and inactive state cycles and such that there is interleaving between the irradiation time-intervals and the measurement time-intervals. FIG. 7 illustrates an example of the state of the radiation sources 14 over time as the radiation sources 14 are cycled between active and inactive states, together with the trend of the temperature profile of the substrate 12 resulting from the switching. As can be seen in the example illustrated in FIG. 7, the substrate 12 temperature increases (i.e., the substrate 12 "heats up") during the periods in which the radiation sources 14 are in the active state, and decreases (i.e., the substrate 12 "cools down") during the periods in which the radiation sources 14 are in the inactive state. In the illustrated example, the substrate 12 temperature increases according to a non-linear function with respect to time during each irradiation time-interval.

Each of the irradiation time-intervals is long enough so as to allow enough time for the substrate 12 to heat up to the appropriate temperature. Irradiation time-intervals in a range of 0.25 to 10 seconds have been found to be particularly effective for heating a semiconductor wafer, however the interval length may vary based on the particular thermal processing application. In addition, each of the measurement time-intervals is preferably shorter than the irradiation time-intervals, and is also preferably short enough such that, compatibly with the synchronization with the switching time of the radiation sources 14, the temperature of the substrate 12 is measured (by the temperature measuring device 16) while having minimal effect on the time-dependent temperature profile. Measurement time-intervals in a range of 0.01 to 0.1 seconds have been found to be particularly effective for measuring the temperature of a semiconductor wafer that is heated for intervals of 0.25 to 10 seconds, but again the measurement time-interval length may vary depending upon the particular processing application.

In certain preferred embodiments, the device 16 measures temperature (and/or thermal radiation) emitted by the substrate 12 continuously or nearly continuously over the entirety of the duration of the measurement time-interval.

Parenthetically, it is noted that the irradiation time-intervals do not necessarily need to be of equal length. Similarly, the measurement time-intervals also do not necessarily need to be of equal length. For example, the irradiation time intervals can successively increase or decrease throughout the duration of the thermal processing of the substrate, and the measurement time-intervals can remain constant or can vary based, for example, on the length of each preceding irradiation time-interval.

FIG. 3 shows a schematic illustration of the temperature measuring device 16 according to certain embodiments of the present disclosure. In the illustrated embodiment, the temperature measuring device 16 includes a sensor 20 coupled to a processor 18. The processor 18 can be one or more computer processors (e.g., microprocessors, microcontrollers, signal processors, and the like). The sensor 20 is configured to detect/sense/measure radiation (thermal radiation, radiation intensity) emitted by the substrate 12 and generate a temperature-indicative electrical signal in response to the sensed thermal radiation. The sensor 20 is preferably sensitive to radiation in a particular wavelength range chosen to provide high sensitivity to changes in the temperature of substrate 12, within the expected range of desirable processing temperatures to which substrate 12 will be heated by the radiation sources 14. In one non-limiting example, the sensor 20 is sensitive to radiation having wavelength at or near 1000 nm. The sensor 20 can be more than one sensor, for example, an array of sensors. The sensor 20 can measure the temperature of the substrate 12 based on the relationship between thermal radiation (irradiance) and temperature given by the Stefan-Boltzmann law, the Planck function, or using a look-up table (which can be stored in a memory associated with the processor 18).

In the illustrated embodiment, the temperature measuring device 16 also includes optics 23, represented schematically by a lens 23 (which can be an assembly of lenses, which can be refractive or reflective), for directing thermal radiation from a scene toward the sensor 20. Alternatively, the optics 23 can be implemented as an optical fiber or fibers (e.g., a fiber optic bundle) or as a light pipe. The optics 23 is deployed to define a field of view corresponding to the region from which thermal radiation will arrive. When the device 16 is deployed to measure the temperature/thermal radiation of the substrate 12, the device 16 is positioned such that the part of the substrate 12 that is to be measured is in the field of view of the scene/region defined by the optics 23. Depending on the deployment configuration of the device 16 relative to the substrate 12, the "part of the substrate" can include one or more portions of the of the substrate 12 or can include the entirety of the substrate 12.

In certain embodiments, the processor 18, the sensor 20 and the optics 23 are maintained within a single casing or mechanical body.

Parenthetically, the thermal radiation emitted by the substrate 12 is generally weak, and therefore the sensor 20—in response to sensing thermal radiation—may generate a proportionally weak temperature-indicative signal that requires some amplification by amplifier circuitry. Therefore, although not shown in the drawings, the sensor 20 output is preferably coupled to an amplifier circuit (e.g., a pre-amplifier) which amplifies the signal generated by the sensor 20.

The synchronization between the temperature measuring device 16 and the switching of the radiation sources 14 can be provided in various ways. According to one set of non-limiting implementations, exemplified in FIG. 1, the controller 24 is electrically associated with (i.e., electrically linked to) the temperature measuring device 16 and provides a synchronization signal to the temperature measuring device 16 corresponding to the irradiation time-intervals and/or the measurement time-intervals. As will be discussed, the synchronization signal can correspond to the inactive state, and/or the transition from the active state to the inactive state, and/or the transition from the inactive state to the active state. Since the controller 24 controls the switching rate of the radiation sources 14, the controller 24 can also provide timing information, for example in the form of the synchronization signal, to the temperature measuring device 16 such that the temperature measuring device 16 only measures the temperature of the substrate 12 during periods corresponding to the measurement time-interval. The processor 18 can receive the synchronization signal, and control the timing of the sensor 20 such that the sensor 20 only measures thermal radiation during the measurement time-interval. In other implementations, the sensor 20 continuously measures thermal radiation intensity, and the processor 18 controls a switch that switchably couples the sensor 20 to an amplifier circuit to close the switch only during the measurement time-interval such that the sensor 20 output is in signal communication with the amplifier circuit only during the measurement time-interval and not in signal communication with the amplifier circuit during the irradiation time-interval. A variation of this implementation will be discussed in subsequent sections of the present disclosure with reference to FIG. 10.

In another set of non-limiting implementations, the sensor is sensitive to radiation emitted by both the radiation sources 14 and the substrate 12, and continuously senses/measures thermal radiation intensity. In such implementations, the processor 18 can be programmed to process the signal generated by the sensor 20 in order to identify sudden drops in the signal which are indicative of drops in measured radiation intensity. Such drops typically correspond to periods in which the radiation sources 14 transition to the inactive state. Therefore, the processor 18 can produce, output and/or store or write to storage (e.g., write to a computer memory linked to the processor 18) only the segment or segments of the signal that are measured after detected sudden signal drops (which correspond to the measurement time-interval, i.e., when the radiation sources 14 are in the inactive state), such that only the temperature measurement during the measurement time-interval are output by the temperature measuring device 16. The processor 18 can similarly be programmed to stop recording measured data when sudden signal increases are detected, corresponding to the transition of the radiation sources to the active state. Accordingly, the apparatus of the present invention produces a temperature measurement of the substrate 12 based on the sensed radiation and the detected sudden drops and increases in the intensity of this sensed radiation. Alternately, rather than identifying the inactive state (for which data should be recorded) based on the change in the measured signal (sudden increases and decreases), the processor 18 could identify the inactive state as whenever the sensed radiation signal drops below a certain threshold signal level.

Figures 8, 9, 10:
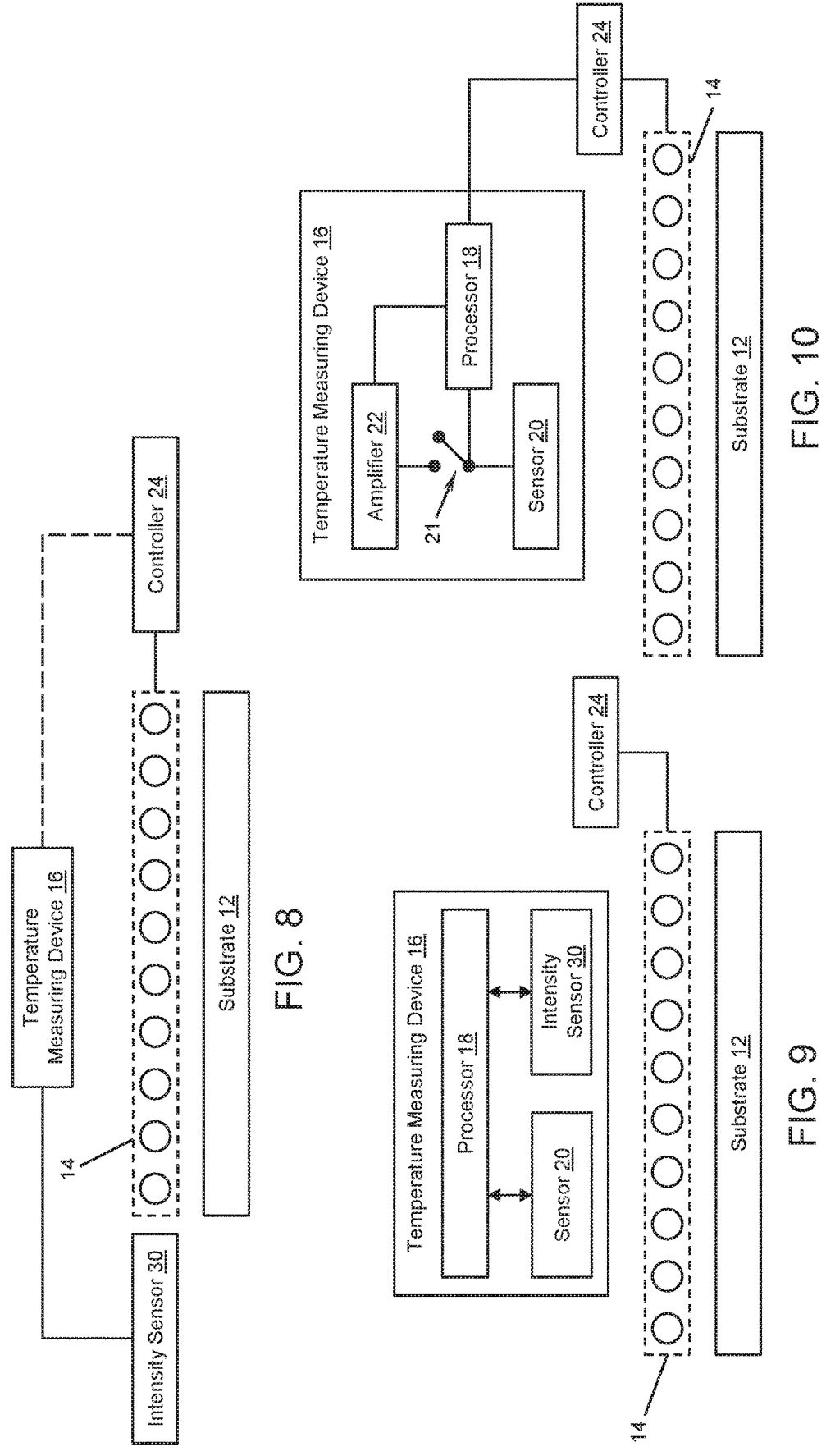
FIG. 8 is a schematic representation of a system having a measuring device having a sensor for measuring/monitoring thermal radiation and temperature of a substrate, heated by switchable radiation sources, that is synchronized to the switching of the radiation sources, according to another embodiment of the present invention in which synchronization is provided by an intensity sensor that measures radiation intensity of the radiation sources.
FIG. 9 is a schematic representation of a system similar to FIG. 8 in which the intensity sensor is integrated as part of the measuring device.
FIG. 10 is a schematic representation of a system similar to FIG. 1, but in which the measuring device includes an amplifier and a switch between the sensor and the amplifier, and in which opening and closing the switch is synchronized with the switching of the radiation sources between active and inactive states.

Referring now to FIGS. 8 and 9, a system and apparatus is illustrated in which synchronization is provided between the temperature measuring device 16 and the switching of the radiation sources 14 according to further embodiments of the present disclosure in which an additional sensor is employed to sense radiation emitted by the radiation sources 14. Looking first at FIG. 8, an intensity sensor 30 (which can be more than one intensity sensor) is deployed to sense radiation emitted by the radiation sources 14 and is electrically associated with the temperature measuring device 16. The intensity sensor is sensitive to radiation at the particular range of wavelengths emitted by the radiation sources 14, and the sensor 20 is sensitive to radiation in the particular range of wavelengths emitted by the substrate 12 when heated by the sources 14. Although not illustrated, the intensity sensor 30 can be associated with optics for directing radiation from a scene (which in this case includes the radiation sources 14) toward the sensor 30. Alternatively, the sensor 30 can be associated with dedicated optics that direct radiation from the radiation sources 14 toward the sensor 30.

The intensity sensor 30 generates the synchronization signal based on detecting/sensing radiation in the wavelength range of relevance, specifically the detecting/sensing of radiation emitted by the radiation sources 14. In certain non-limiting implementations, the intensity sensor generates the synchronization signal upon detecting/sensing radiation emitted by the radiation sources 14. In other non-limiting implementations, the intensity sensor 30 generates the synchronization signal in the event that no radiation in the wavelength range of relevance is detected/sensed by the intensity sensor 30.

The intensity sensor 30 provides the synchronization signal to the temperature measuring device 16, which performs a thermal radiation measurement (via the sensor 20) according to the synchronization signal such that the sensor 20 only measures thermal radiation (emitted by the substrate 12) during the measurement time-interval (corresponding to inactive periods of the radiation sources 14). For example, the processor 18 of the temperature measuring device 16 can command the sensor 20 to perform thermal radiation measurements in response to receipt of the synchronization signal from the intensity sensor 30.

FIG. 9 shows an alternative configuration similar to FIG. 8, but in which the intensity sensor 30 is integrated as part of the temperature measuring device 16 such that both sensors 20, 30 are deployed within a single casing or mechanical body. Here, just as in FIG. 8, the intensity sensor 30 detects/senses/measures radiation emitted by the radiation sources 14 in order to determine when the radiation sources 14 are in the inactive state (corresponding to the measurement time-interval) and/or when the radiation sources 14 are in the active state (corresponding to the irradiation time-interval). Each of the sensors 20 and 30 can have separate optics (i.e., sensor 20 can be associated with optics 23 as in FIG. 3, and sensor 30 can have separate optics as alluded to above with reference to FIG. 8). Alternatively, the sensors 20 and 30 can share optics (e.g., optics 23 from FIG. 3), which can be deployed to direct radiation from both the radiation sources 14 and the substrate 12 toward the sensors 20 and 30.

In the embodiment illustrated in FIG. 9, the processor 18 can receive the synchronization signal from the intensity sensor 30 and can command the sensor 20 to perform thermal radiation measurements based on the received synchronization signal.

FIG. 10 illustrates another embodiment that is similar to FIG. 1, except here the temperature measuring device 16 also includes an amplifier circuit 22 for amplifying the temperature-indicative signal generated by the sensor 20, and a switch 21 that selectively places the sensor 20 into signal communication with the amplifier 22. The sensor 20 also continuously measures thermal radiation intensity and in addition to being sensitive to radiation in the particular range of wavelengths emitted by the substrate 12 when heated by the sources 14, may also be sensitive to radiation at the particular range of wavelengths emitted by the radiation sources 14. Nominally, the switch 21 can be in the open position such that the sensor 20 is de-coupled from (i.e., not in signal communication with) the amplifier 22. Thus, when the switch 21 is in the open position the output signal generated by the sensor 20 in response to any radiation measurements is not amplified. When the switch 21 is in the closed position, the sensor 20 is placed into signal communication with the amplifier 22 such that the output signal generated by the sensor 20 in response to any thermal radiation measurements is amplified by the amplifier 22. The switching of the switch 21 between the open and closed positions is controlled by control input received from the controller 24 in the form of a synchronization signal such that the amplifier 22 is de-coupled from the sensor 20 at the time, or an amount (small amount) of time before the time, that the radiation sources 14 are switched from the inactive state to the active state. In the illustrated example, the processor 18 acts as a relay which actuates the switch 21 to open and close based on the synchronization received from the controller 24. The controller 24 provides the synchronization signal in correspondence with the switching of the radiation sources 14 between the active and inactive states, such that when the radiation sources 14 are in the active state the switch 21 is in the open position so as to de-couple the amplifier 22 from the sensor 20, and when the radiation sources 14 are in the inactive state the switch 21 is in the closed position. Thus, the switch is primarily closed during the measurement time-interval such that the amplifier 22 amplifies signals generated by the sensor 20 only during the measurement time-interval, and the switch 21 is primarily open during the irradiation time-interval such that the thermal radiation intensity measurement performed by the sensor 20 is not amplified and the temperature measurement performed by the device 16 is effectively interrupted/terminated.

The synchronization signal utilized in the embodiments of the present disclosure can take on various forms, including, for example, forms of a time-varying signal that is continuous over a specified time-duration, one or more pulse or step signals, one or more trigger-type signals that can include pulse/step signals, or a digital signal. In one non-limiting example, the synchronization signal is a pulse or step that takes on a high or low value or values when the radiation sources 14 are in the active state, and takes on a low or high value or values when the radiation sources 14 are in the inactive state. In such an example, the temperature measuring device 16 measures temperature (via thermal radiation sensing by the sensor 20) during time-intervals during which the synchronization signal has low or high value(s) (corresponding to the inactive time-interval).

In another non-limiting example, for each of the inactive time-intervals the synchronization signal can include a start trigger pulse that indicates the beginning of the inactive time-interval, and an end trigger pulse that indicates the end of the inactive time-interval. In such an example, the temperature measuring device 16 begins to measure temperature upon receipt of the start trigger pulse and continues to measure temperature until receiving the end trigger pulse. In another similar non-limiting example, for each of the active time-intervals the synchronization signal can include a start trigger pulse that indicates the beginning of the active time-interval, and an end trigger pulse that indicates the end of the active time-interval. In such an example, the temperature measuring device 16 begins to measure temperature upon receipt of an end trigger pulse (associated with the end of one active time-interval) and continues to measure temperature until receiving a start trigger pulse (associated with the beginning of the next active time-interval). In yet another similar non-limiting example, a single trigger pulse can be used to indicate the transition of the radiation sources to the inactive state, with the inactive state pre-programmed to last for a duration equal to or slightly longer than the time required for the temperature probe to take a single measurement. At the end of this preprogrammed time-interval, the radiation sources automatically return to the active state, without sending a trigger pulse to indicate this transition.

It should be apparent that combinations of the above are also contemplated herein. For example, the synchronization signal can include start and end trigger pulses of high or low value indicating the beginning and end, respectively, of an active time-interval, and can include start and end trigger pulses of low or high value indicating the beginning and end, respectively, of an inactive time-interval.

In certain non-limiting implementations, the synchronization signal can act as a trigger signal that triggers the temperature measuring device 16 to begin measuring the temperature of the substrate 12, while in other implementations the synchronization signal can act as a trigger signal that triggers the temperature measuring device 16 to stop measuring the temperature of the substrate 12. In yet other non-limiting implementations, the receipt of the synchronization signal (by the temperature measuring device 16) triggers the temperature measuring device 16 to measure the temperature of the substrate 12, while in other implementations the absence of the receipt of the synchronization signal triggers the temperature measuring device 16 to measure the temperature of the substrate 12.

Figure 11:
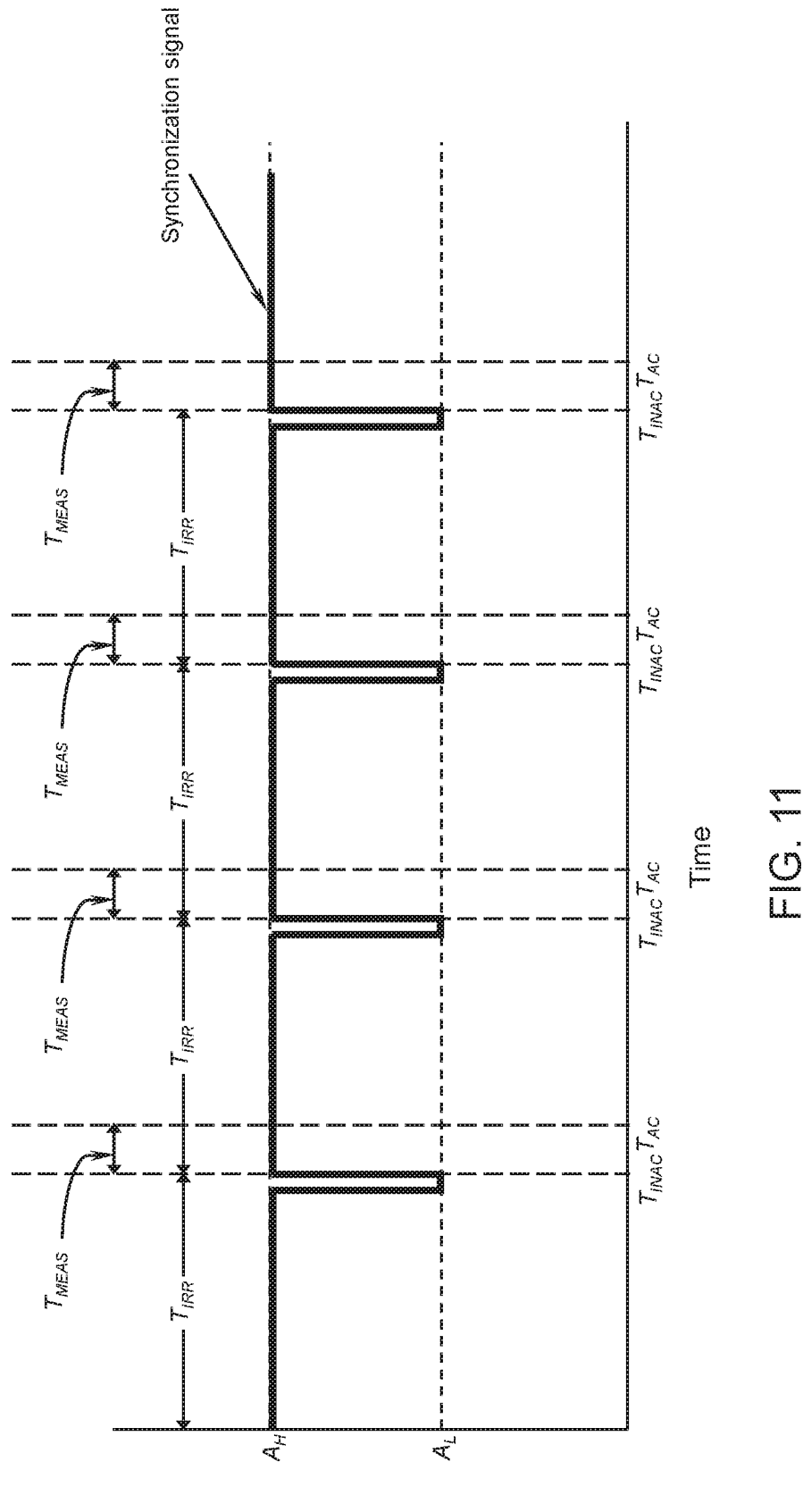
FIG. 11 is a non-limiting example of a synchronization signal that can be used to provide synchronization between the measuring device and the switching of the radiation sources.

With continued reference to FIGS. 4-10, refer now to FIG. 11, which illustrates an example of a synchronization signal that can be used to provide synchronization between the temperature measuring device 16 and the switching of the radiation sources 14 between active and inactive states. Here, the switching of the radiation sources from active to inactive state occurs on the rising-edge of the synchronization signal, when the signal increases from a "low" signal level (designated $A_L$) to a "high" signal level (designated $A_H$). These instances occur at times labeled $T_{INAC}$ in the figure. Measurement device 16 initiates its temperature measurement simultaneously with this rising signal, and completes the temperature measurement within a pre-specified time interval (designated $T_{MEAS}$ in FIG. 11), after which the radiation sources 14 automatically return to the active state, at times labeled $T_{AC}$ in this figure. Thus, the temperature measuring device 16 is able to measure the temperature of the substrate 12 only during the measurement time-intervals, i.e., during periods in which the radiation sources 14 are in the inactive state.

The synchronization signal can, for example, be implemented as an electrical signal, where the "high" and "low" amplitude values correspond to high and low voltages used to generate the signal, e.g., 5 volts for "high" and 0 volts for "low".

The synchronization between the temperature measuring device 16 and the switching of the radiation sources 14 between the active and inactive states, in particular when implemented as LEDs or laser sources, provides a significant advantage over conventional substrate temperature monitoring solutions by enabling the temperature measuring device 16 to measure temperature/thermal radiation only during periods in which the radiation sources 14 are in the inactive state (and preferably for the entirety of the duration of the period when the radiation sources 14 are in the inactive state). By doing so, the temperature measuring device does not suffer from the effects of glare from the much stronger heating radiation sources, which will in general hinder the ability of the temperature probe to be able to accurately detect the typically orders-of-magnitude smaller thermal radiation signal emanating from the substrate 12.

In particularly preferred synchronization implementations, the synchronization enables the device 16 to start the temperature measurement exactly at the moment the radiation sources 14 are switched to the inactive state, and return the radiation sources to the active state exactly at the moment that the temperature probe completes its temperature measurement. Such synchronization implementations reduce to a minimum the duration of the inactive state, thus reducing the uncontrolled cooling of the substrate 12 which occurs during the inactive state intervals, as shown schematically in FIG. 7. Furthermore, reduction of the inactive state time interval to an absolute minimum, can allow more frequent inactive state measurement intervals to be inserted into the heating profile, which can be of particular importance when used in combination with a closed-loop temperature control scheme, where more-frequent temperature measurements allow for more frequent control corrections by the temperature controller—leading to tighter and more robust temperature control.

It is noted, however, that the measurement and synchronization schemes disclosed herein may also be applicable to situations that do not require precise closed-loop control, such as for data recording or collection purposes, or scenarios in which an alarm or warning is issued if the measured temperature is outside of a preferred temperature range.

Figures 12, 14:
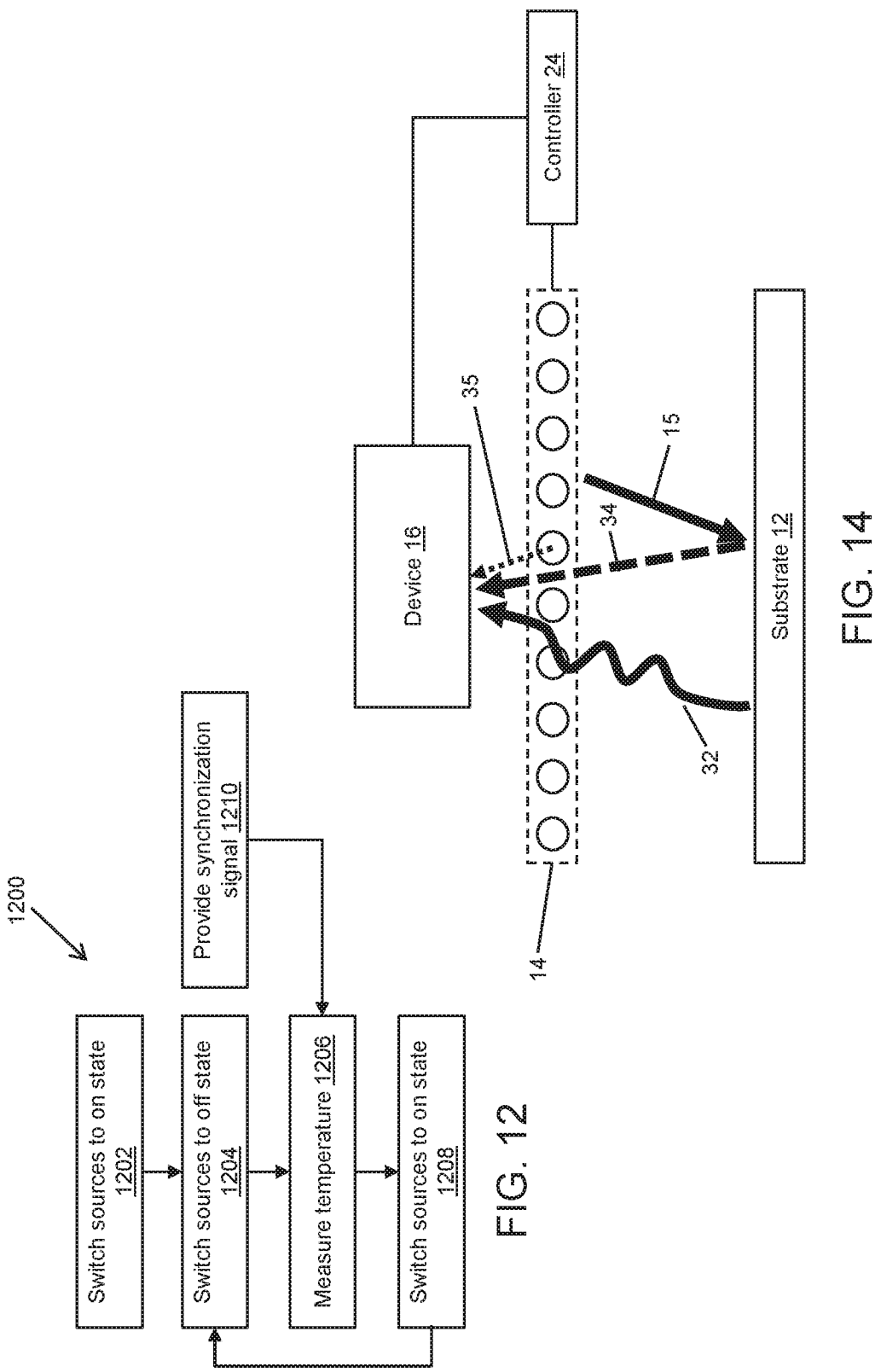
FIG. 12 is a flow diagram illustrating a process for measuring/monitoring the temperature of a substrate according to embodiments of the present invention.
FIG. 14 is a schematic representation of a system similar to that of FIG. 1, in which the device measures reflectivity and/or emissivity of the substrate by measuring thermal radiation of the substrate when the radiation sources are in the inactive state, and thermal radiation of the substrate and reflected radiation from the substrate when the radiation sources are in the active state.

Attention is now directed to FIG. 12 which shows a flow diagram detailing a process (i.e., method) 1200 for measuring/monitoring the temperature of a substrate in accordance with embodiments of the disclosed subject matter. Reference is also made to FIGS. 1-11. The process and sub-processes of FIG. 12 are performed by the sources 14, the temperature measuring device 16 and associated components thereof, including the sensor 20 and optionally the sensor 30. Some of the processes and sub-processes of FIG. 12 are computerized processes performed by the controller 24 and/or the processor 18. The aforementioned processes and sub-processes are for example, performed automatically and preferably in real-time. It is assumed that prior to performing the process of FIG. 12, the substrate 12 is already deployed in a substrate processing system, such as a thermal processing chamber, that includes sources of the heat and/or radiation (e.g., sources 14), which in certain embodiments are deployed for irradiating the substrate 12 so as to heat the substrate, and a computerized control device (e.g., controller 24) for switching the sources on and off so as to control switching between the active and inactive states, as well as in certain embodiments controlling the level of radiation intensity emitted by the sources when in the active state.

The process 1200 begins at step 1202 where the controller 24 switches the sources 14 to the active state such that the sources 14 heat the substrate 12. In the context of thermal processing, the sources 14 are radiation sources that when switched to the active state in step 1202 irradiate the substrate 12, thereby heating the substrate 12 during an irradiation time-interval. At step 1204, the controller 24 switches the sources 14 to the inactive state such that the sources 14 cause no radiation or a negligible amount of radiation to be generated. In the context of thermal processing, when switched to the inactive state at step 1204, the sources 14 no longer irradiate the substrate 12 such that the sources 14 emit no radiation or a negligible amount of radiation. The sources 12 are maintained in the inactive state during a measurement time-interval. At step 1206, the temperature measuring device 16, deployed in proximity to the substrate 12, begins measuring the temperature of the surrounding environment so as to measure the temperature of the substrate 12 at the beginning of the measurement time-interval (which is the end of the irradiation time-interval). Following the completion of the temperature measurement, the process 1200 then moves to step 1208—which is generally identical to step 1202—in which the controller 24 switches the sources 14 to the active state such that the sources 14 heat the substrate 12. Due to the synchronization between the temperature measuring device 16 and the switching of the sources 14 between the active and inactive states, the temperature measuring device stops measuring the temperature of the surrounding environment such that no thermal radiation emitted by the substrate and no radiation caused (and in the context of thermal processing emitted) by the sources 14 is captured by the temperature measuring device 16. The process 1200 then returns to step 1204 and repeats itself until the temperature monitoring is terminated.

In certain embodiments, the process 1200 includes an additional step 1210 in which a synchronization signal is provided to the temperature measuring device 16 (either by the controller 24 or by an intensity sensor 30 deployed to measure radiation intensity emitted by the radiation sources 14), that indicates when the radiation sources 14 are in the active and inactive states such that the temperature measuring device 16 can start and stop the temperature measurement in synchrony with the switching between the active and inactive states.

Although embodiments of the present disclosure have been described thus far as having a temperature measuring device 16 synchronized with the switching rate of sources 14 that are electronically controlled by a dedicated controller 24 that is separate from the temperature measuring device 16, other embodiments are possible in which the controller is integrated as part of the temperature measuring device. Such embodiments may be of particular value when the temperature measuring device is implemented as a temperature probe that is integrated as part of a thermal processing system. In such embodiments, the processor of the temperature monitoring device can be configured to perform the functions of the controller 24 described above (for example with reference to FIGS. 1 and 2), and the controller 24 itself can be removed. Thus, the processor of the temperature measuring device, e.g., the processor 18, can control the switching of the radiation sources 14 between active and inactive states and provide synchronization to the sensor 20 (or an amplifier switch, for example the switch 21 in FIG. 10).

Although the temperature control/monitoring/measuring methods, apparatus and devices of the present disclosure are particularly suitable for use with radiation sources 14 implemented as a plurality of electronically controllable and switchable LEDs or lasers, the methods, apparatus and devices are also useful when deployed with radiation sources 14 implemented as lamps or other incandescent sources. In such implementations, it may be advantageous to add a time delay to the measurement time-interval start time in order to account for the time it takes for residual radiation emission to dissipate after the lamps or other incandescent sources are switched off. The delay can be dynamically included in the synchronization signal, or can be programmed into the processor 18 of the temperature measuring device 16. The addition of such a delay-time to the measurement-interval start-time can also be used to compensate for delays introduced by other elements of the system besides the radiation sources themselves, but which lead to a delay in the time required for the radiation sources to reduce their radiation output to a negligible level. For example, the radiation-source power-supply could also introduce delays or time-dynamics to the reduction of the radiant output by the radiation sources, and these delays and time-dynamics can also be compensated by the addition of a time-delay to the measurement-interval start time.

The various sensors described herein are sensors of electromagnetic radiation that can be sensitive to radiation in specific wavebands or wavelength regions of the electromagnetic spectrum. These sensors can also be referred to as "detectors", and can be implemented in various ways, including, for example, as photodetectors, photosensors, photodiodes, or any other type of sensing device that can convert sensed electromagnetic radiation into an electrical current or other type of information bearing signal. In certain embodiments, the sensor 20 and/or the sensor 30 generates/generate analog signals in response to sensed radiation, whereas in other embodiments the sensor 20 and/or the sensor 30 generates/generate digital signals in response to sensed radiation. In embodiments in which an analog signal is generated by the sensor(s), analog-to-digital conversion circuitry is preferably in signal communication with the sensor(s) in order to convert the analog signal to a digital signal.

As mentioned, the radiation sources (e.g., LEDs, lasers) have a peak emission wavelength that may be different from the wavelength at which the temperature measuring device, according to the embodiments disclosed herein, is operative. In embodiments in which a sensor is utilized to detect the absence or presence of radiation (in a wavelength range of relevance) emitted by the radiation sources in order to generate a synchronization signal (e.g., intensity sensor 30), it should be understood that such a sensor most preferably operates at or near the peak emission wavelength of the radiation sources. In addition, it should be understood that the wavelength values and ranges described above and illustrated in the drawings are exemplary only, and were generally provided in order to more clearly demonstrate the temperature measuring/monitoring methodology of the embodiments of the present disclosure. The teachings according to the embodiments of the present disclosure can be applied to radiation emission and measurement for other wavelength values and ranges, as should be apparent to those of ordinary skill in the art.

As mentioned above, according to a second aspect of the present disclosure, the device 16 is also configured to measure radiation in order to enable determination of the reflectivity and/or the emissivity of the substrate 12. As discussed above, the device 16 is generally configured to measure radiation from the substrate 12 (as well as the environment surrounding the substrate 12), and so can be used, in combination with the synchronization methodology described above, to determine and/or calculate and/or monitor and/or measure one or more parameters of the substrate 12 in addition to temperature, including in particular the reflectivity and/or emissivity of the substrate 12. The following paragraphs describe the methodology for determining the reflectivity and/or emissivity of the substrate 12 according to this aspect of the present disclosure, with continued reference to FIGS. 1-13B and with particular reference to FIG. 14.

By way of introduction, the reflectivity and transmissivity of the substrate can be used to determine the emissivity of the substrate 12 (as a consequence of the first and second laws of thermodynamics), by the relation: emissivity=1−reflectivity−transmissivity.

For the special case where the measuring device operates in a waveband where the transmissivity of the substrate is effectively zero (a waveband where the substrate is opaque), the emissivity can be determined by a measurement of the substrate reflectivity alone (since the transmissivity is nearly zero).

Therefore, if the reflectivity of the substrate 12 can be determined within a waveband where the substrate is effectively opaque, then the emissivity of the substrate 12 within that waveband can easily be calculated therefrom. According to certain embodiments of the second aspect of the present disclosure, the reflectivity of the substrate 12 is first determined, and the emissivity of the substrate 12 is subsequently calculated based on the determined reflectivity.

According to certain embodiments, the reflectivity of the substrate 12 is determined based on measurements (performed by the device 16) made when the radiation sources 14 are in the inactive state and the active state. The following paragraphs describe a particular exemplary method by which the substrate reflectivity can be determined from the inactive and active state measurements.

With reference to FIG. 14, when the radiation sources are in the inactive state, the measurement device 16 collects thermal radiation from the substrate 12. This radiation is represented by the wavy arrow 32. When the radiation sources are switched to the active state, the measurement device 16 continues to collect thermal radiation emitted by the substrate 12, and in addition collects (a) radiation emitted by the radiation sources 14 after reflection off the substrate 12, as represented by the thick dashed arrow 34, and also (b) radiation emitted by the radiation sources 14 which impinges on the measurement device 16 without first reflecting off the substrate 12, as represented by the thin dotted arrow 35. It will be appreciated that the arrows shown in FIG. 14 represent only exemplary paths which could be taken by each class of radiation described in this paragraph.

Let $I_{inactive}$ be the radiation intensity incident on device 16 when the radiation sources 14 are in the inactive state, and $I_{active}$ active be the radiation intensity incident on device 16 when the radiation sources are in the active state with a particular power setting, which we will refer to as power $P_{reflectivity}$. Note that the difference between these two signals $I_{difference}=I_{active}-I_{inactive}$, does not depend on the intensity of the thermal-self-emission being emitted by the substrate 12, but does contain information about radiant intensity 34 reflected off the substrate 12.

To convert $I_{difference}$ into a reflectivity value representing the reflectivity of the substrate 12, it is necessary to perform a calibration procedure. There are many possible ways to calibrate this measurement, and one exemplary method is described here as follows:

Measure $I_{difference}$ when two substrates 12 of known reflectivity $\rho_{ref1}$ and $\rho_{ref2}$ respectively are placed in the system 10. The two values of $I_{difference}$ for these two substrates are referred to as $I_{diff1}$ and $I_{diff2}$ (corresponding to the measurements with substrates of reflectivity $\rho_{ref1}$ and $\rho_{ref2}$ respectively). For example, typically in semiconductor processing applications, a bare silicon wafer can be used as one of the reference substrates, with known reflectivity $\rho_{ref1}=0.32$ at 950 nm wavelength and 30° C. The other reference reflectivity can be, for example, a system 10 where the substrate 12 has been removed entirely, resulting in $\rho_{ref2}=0$. (Note that in this case, it may be necessary in some system designs to also remove any reflective surfaces immediately behind substrate 12, which may reflect radiation into device 16 even in the absence of the substrate 16). Then the general reflectivity $\rho$ of any substrate placed in system 10 can be calculated as:

$$\rho=C_1 I_{difference}+C_2$$

where the constants $C_1$ and $C_2$ are given in terms of the calibration measurements as:

$$C_1 = \frac{\rho_{ref1} - \rho_{ref2}}{I_{diff1} - I_{diff2}}$$

$$C_2 = \rho_{ref1} - C_1 I_{diff1}$$

The above equations are appropriate for situations where the reflected radiation 34 collected by the measurement device 16 typically undergoes only one reflection from substrate 12 prior to impinging on measurement device 16. In cases where the geometry of system 10 is such that a significant intensity of reflected radiation 34 undergoes multiple reflections off the substrate 12 prior to impinging on measurement device 16, the above equation needs to be modified to account for the effects of these multiple reflections. These multiple-reflection effects are referred to as "cavity effects" and formulas for modifying the above equation to account for these effects are well known to those of ordinary skill in the art.

Considering now the general case where it is desired to perform all of the following three actions while processing a given substrate 12: (a) heat the substrate to a desired temperature profile, (b) measure the substrate temperature (or thermal self-emission) and (c) measure the substrate reflectivity (and hence the emissivity of an opaque substrate), the required actions are respectively: (a) place the radiation sources in the active state at some power-setting which is expected to give the desired substrate heating profile, (b) periodically place the radiation sources in the inactive state to measure the temperature (and $I_{inactive}$ for the reflectivity measurement), and (c) periodically put the radiation sources in the active state at power-setting $P_{reflectivity}$ to measure $I_{active}$ or the reflectivity measurement.

Note that it is expected that the substrate emissivity (and reflectivity) will change very slowly relative to the substrate temperature, so that the three measurements described in the previous paragraph do not need to be performed at the same frequency. Generally, it is expected that most (>80%) of the processing time would be allocated to (a) heating the wafer to the desired temperature profile. The remaining <20% of the processing time would be allocated to measuring temperature (thermal self-emission) and emissivity (reflectivity) of the substrate 12, with the temperature measurement being performed considerably more frequently than the emissivity measurement. For example, if the emissivity of the substrate is thought to vary only very weakly as a function of temperature, it may be advantageous to measure the emissivity only once upon entry of the substrate into the processing system 10, and after that, only heat the substrate 12 and measure its temperature, without repeating the reflectivity measurement during the course of processing of that substrate. Alternately, the emissivity of the substrate 12 could be measured, for example, once every 10 temperature measurements, over the course of processing the substrate.

Although the invention has been described within the context of a thermal processing system used for heating and processing a substrate, the temperature measuring/monitoring/tracking methodology described herein is applicable to any heat treatment processes in which the temperature of a workpiece needs to be measured/monitored/tracked while being heated, at least intermittently or periodically, by one or more sources.

As previously mentioned, in certain wafer processing systems the sources 14 cause heating of the substrate 12 and cause generation of radiation, but there is no causal relationship between radiation that is generated when the sources 14 are in the active state and the heating of the substrate 12. In other words, in certain cases the sources 14 themselves are not radiation sources that irradiate the substrate 12 so as to heat the substrate 12, and any radiation that is generated as a result of (caused by, due to) the sources 14 being in the active state is not the cause of heating of the substrate but is rather a byproduct or side-effect of some other aspect of the wafer process. Plasma-etching or plasma-deposition systems is one example of such a process, in which a wafer is heated due to physical bombardment of the wafer by charged particles in the plasma. The collision of these particles with each other and the wafer also cause radiation to be generated (i.e., emission of radiation), which can interfere with wafer temperature measurement. However, the generated radiation is not the cause of the heating of the wafer, but is a byproduct of the particle bombardment. Nevertheless, in order to accurately measure/sense the wafer thermal emission, it may be useful to be able to turn plasma off so as to eliminate interfering plasma radiation during wafer temperature measurement.

Accordingly, and as previously discussed, the sources 14 according to the embodiments of the present disclosure are not necessarily limited to radiation sources that irradiate the substrate, but in general are sources which cause heating of the substrate 12 when in the active state. Further, the inactive state more generally corresponds to the state in which the sources 14 cause substantially no radiation or a negligible amount of radiation to be generated so as to not interfere with substrate temperature measurement. In certain particularly preferred embodiments, the sources 14 are radiation sources such as LEDs or lasers that irradiate the substrate thereby heating the substrate, and which can also be controlled to quickly turn on and off such that the radiation sources emit no radiation or a negligible amount of radiation when in the inactive state. In other embodiments, the sources 14 cause heating of the substrate when in the active state, for example when implemented as plasma in the case of plasma-etching or plasma-deposition systems. In such embodiments, the sources 14 cause substantially no radiation or a negligible amount of radiation to be generated when the sources are in the inactive state, which in the example of the sources being plasma refers to the state in which no charged particles bombard the wafer, such that the charged particles do not collide with each other or the wafer thereby resulting in no radiation or a negligible amount of radiation being generated.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As used herein, the singular form, "a", "an" and "the" include plural references unless the context clearly dictates otherwise.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

To the extent that the appended claims have been drafted without multiple dependencies, this has been done only to accommodate formal requirements in jurisdictions which do not allow such multiple dependencies. It should be noted that all possible combinations of features which would be implied by rendering the claims multiply dependent are explicitly envisaged and should be considered part of the invention.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

What is claimed is:

1. A method for measuring temperature of a substrate comprising:

switching one or more sources having response times defined by rise and fall times of less than 100 milliseconds between:

an active state in which the one or more sources heat at least one portion of the substrate, and an inactive state in which the one or more sources cause substantially no radiation or a negligible amount of radiation to be generated; and by a temperature measuring device, performing a temperature measurement of the at least one portion of the substrate, wherein the temperature measuring device is synchronized to the switching between the active and inactive states such that:

i) the one or more sources are switched to the inactive state from the active state within the response times and the temperature measurement is started immediately after the one or more sources are switched to the inactive state, ii) immediately after completion of the temperature measurement, the one or more sources are switched to the active state from the inactive state within the response times, and iii) the temperature measurement is performed only when the one or more sources are in the inactive state, thereby preventing radiation from the one or more sources from obscuring the temperature measurement performed by the temperature measuring device, wherein performing the temperature measurement includes sensing radiation within a measurement wavelength band, wherein the measurement wavelength band is selected to exclude a peak emission wavelength of the one or more sources.

2. The method of claim 1, wherein the one or more sources irradiate the substrate during the active state so as to heat the substrate.

3. The method of claim 1, wherein the one or more sources includes a plurality of light-emitting diodes or a plurality of laser sources deployed to irradiate the substrate.

4. The method of claim 1, wherein the one or more sources includes plasma deployed to bombard the substrate with charged particles during the active state.

5. The method of claim 1, wherein the temperature measuring device is synchronized to the switching between the active and inactive states via a synchronization signal corresponding to at least one of: the inactive state, transition from the active state to the inactive state, or transition from the inactive state to the active state.

6. The method of claim 5, wherein the synchronization signal is provided by an intensity sensor deployed to sense radiation emitted by the one or more sources.

7. The method of claim 5, wherein the synchronization signal is provided by a controller associated with the one or more sources that controls switching of the one or more sources between the active and inactive states.

8. The method of claim 1, wherein the temperature measuring device includes a sensor that senses radiation emitted by the sources, and is synchronized to the switching of the one or more sources between the active and inactive states by identifying drops in the emitted radiation corresponding to initiation of the inactive state.

9. The method of claim 1, wherein the active state is associated with at least one irradiation time-interval, and wherein each of the at least one irradiation time-interval is a time interval during which the one or more sources emit radiation at an output power or average output power taken over the entirety of the time interval that is sufficiently high so as to heat the substrate, and wherein the inactive state is associated with at least one measurement time-interval, and wherein each of the at least one measurement time-interval is a time interval during which the one or more sources do not emit radiation or emit radiation at an output power that is sufficiently low so as to be negligible to the temperature measuring device.

10. A system for measuring temperature of a substrate comprising:

one or more sources, having response times defined by rise and fall times of less than 100 milliseconds, deployed in association with the substrate, the one or more sources switchable between: an active state in which the one or more sources heat at least one portion of the substrate, and an inactive state in which the one or more sources cause substantially no radiation or a negligible amount of radiation to be generated;

a controller including at least one processor and configured to switch the one or more sources between the active state and the inactive state; and a temperature measuring device configured to perform a temperature measurement of the at least one portion of the substrate, wherein the temperature measuring device and the switching between the active and inactive states are synchronized to each other such that:

i) the one or more sources are switched to the inactive state from the active state by the controller within the response time and the temperature measurement is started immediately after the one or more sources are switched to the inactive state, ii) immediately after completion of the temperature measurement, the one or more sources are switched to the active state from the inactive state by the controller within the response time, and iii) the temperature measurement is performed only when the one or more sources are in the inactive state, thereby preventing radiation from the one or more sources from obscuring the temperature measurement performed by the temperature measuring device, wherein the temperature measuring device is configured to perform the temperature measurement by sensing radiation within a measurement wavelength band, wherein the measurement wavelength band is selected to exclude a peak emission wavelength of the one or more sources.

11. The system of claim 10, wherein the at least one temperature measuring device is synchronized to the switching of the one or more sources via a synchronization signal corresponding to at least one of: the inactive state, transition from the active state to the inactive state, or transition from the inactive state to the active state.

12. The system of claim 11, wherein the synchronization signal is provided to the at least one temperature measuring device by the controller.

13. The system of claim 11, further comprising: at least one intensity sensor deployed to sense radiation emitted by the one or more sources and configured to provide the synchronization signal to the at least one temperature measuring device.

14. The system of claim 10, wherein the at least one temperature measuring device measures radiation and is synchronized to the switching of the one or more sources by identifying drops in the radiation measurement corresponding to initiation of the inactive state.

15. The system of claim 10, wherein the one or more sources includes a plurality of light-emitting diodes or a plurality of laser sources.

16. The system of claim 10, wherein the active state is associated with at least one irradiation time-interval, and wherein each of the at least one irradiation time-interval is a time interval during which the one or more sources emit radiation at an output power or average output power taken over the entirety of the time interval that is sufficiently high so as to heat the substrate, and wherein the inactive state is associated with at least one measurement time-interval, and wherein each of the at least one measurement time-interval is a time interval during which the one or more sources do not emit radiation or emit radiation at an output power that is sufficiently low so as to be negligible to the temperature measuring device.

17. A method comprising:

switching one or more radiation sources having response times defined by rise and fall times of less than 100 milliseconds between:

an active state in which the one or more radiation sources irradiate at a substrate so as to heat the substrate, and an inactive state in which the one or more radiation sources emit substantially no radiation or emit a negligible amount of radiation;

performing by a device:

a first radiation measurement during the inactive state, the first radiation measurement including radiation corresponding to thermal emission by the substrate, and a second radiation measurement during the active state, the second radiation measurement including radiation corresponding to thermal emission by the substrate and radiation reflected by the substrate in response to radiation emitted by the one or more radiation sources, wherein the device is synchronized to the switching between the active and inactive states such that:

i) the one or more sources are switched to the inactive state from the active state within the response times and the first radiation measurement is started immediately after the one or more sources are switched to the inactive state, ii) immediately after completion of the temperature measurement, the one or more sources are switched to the active state from the inactive state within the response times, and iii) the first radiation measurement is performed only when the one or more sources are in the inactive state, thereby preventing radiation from the one or more sources from obscuring the radiation measurement performed by the device, wherein performing the first radiation measurement and the second radiation measurement includes sensing radiation within a measurement wavelength band, wherein the measurement wavelength band is selected to exclude a peak emission wavelength of the one or more radiation sources; and calculating, based on the first and second radiation measurements, at least one of a reflectivity of the substrate or an emissivity of the substrate.

\* \* \* \* \*